United States Patent
Dia et al.

(10) Patent No.: US 12,191,310 B2
(45) Date of Patent: Jan. 7, 2025

(54) LOGIC CELL WITH SMALL CELL DELAY

(71) Applicant: MEDIATEK INC., Hsinchu (TW)

(72) Inventors: Kin-Hooi Dia, Hsinchu (TW); Ho-Chieh Hsieh, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 412 days.

(21) Appl. No.: 17/535,760

(22) Filed: Nov. 26, 2021

(65) Prior Publication Data

US 2022/0223623 A1 Jul. 14, 2022

Related U.S. Application Data

(60) Provisional application No. 63/135,766, filed on Jan. 11, 2021.

(51) Int. Cl.
 *H01L 27/118* (2006.01)
(52) U.S. Cl.
 CPC ......... *H01L 27/11807* (2013.01); *H01L 2027/11825* (2013.01); *H01L 2027/11875* (2013.01); *H01L 2027/11881* (2013.01)
(58) Field of Classification Search
 CPC ..... H01L 27/11807; H01L 2027/11825; H01L 2027/11875; H01L 2027/11881; H01L 21/823437; H01L 21/823481; H01L 21/823828; H01L 21/823878; H01L 27/092; H01L 21/823821; H01L 27/088; H01L 2027/1183; H01L 2027/11874; H01L 27/0207; H01L 27/0886
 See application file for complete search history.

(56) References Cited

U.S. PATENT DOCUMENTS

| | | | |
|---|---|---|---|
| 11,171,138 B2 | 11/2021 | Huang et al. | |
| 11,183,497 B2 | 11/2021 | Lee et al. | |
| 2015/0009750 A1* | 1/2015 | Schaefer | H10B 10/00 365/156 |

(Continued)

FOREIGN PATENT DOCUMENTS

| TW | 202038433 A | 10/2020 |
|---|---|---|
| TW | 202044515 A | 12/2020 |

OTHER PUBLICATIONS

EP Office Action dated Aug. 5, 2022 in Eurpoean application No. 21215515.4-1212/4027386.

*Primary Examiner* — Yasser A Abdelaziez
(74) *Attorney, Agent, or Firm* — McClure, Qualey & Rodack, LLP

(57) ABSTRACT

A semiconductor structure is provided. A logic cell with a logic function includes a plurality of first transistors in an active region over a semiconductor substrate, a second transistor in the active region, a third transistor in the active region, and first and second isolation structures on opposite edges of the active region and extending along the first direction. Each first transistor includes a first gate electrode extending along the first direction. The second transistor includes a second gate electrode extending along the first direction. The third transistor includes a third gate electrode extending along the first direction. The first gate electrodes are disposed between the first and second isolation structures. The second gate electrode is disposed between the first gate electrodes and the first isolation structure. The third gate electrode is disposed between the first gate electrodes and the second isolation structure.

7 Claims, 27 Drawing Sheets

(56) References Cited

U.S. PATENT DOCUMENTS

| | | | |
|---|---|---|---|
| 2015/0035065 A1* | 2/2015 | Park | H01L 27/105 257/773 |
| 2019/0123140 A1* | 4/2019 | Park | H01L 21/823437 |
| 2019/0237542 A1 | 8/2019 | Chen et al. | |
| 2019/0296126 A1* | 9/2019 | Song | H01L 21/823475 |
| 2020/0313659 A1 | 10/2020 | Guo et al. | |
| 2020/0328216 A1 | 10/2020 | Liaw | |
| 2020/0411063 A1 | 12/2020 | Fujiwara et al. | |
| 2021/0005606 A1 | 1/2021 | Lee et al. | |

* cited by examiner

LOGIC CELL WITH SMALL CELL DELAY

CROSS REFERENCE TO RELATED APPLICATIONS

This application claims priority of U.S. Provisional Application No. 63/135,766, filed on Jan. 11, 2021, the entirety of which is incorporated by reference herein.

BACKGROUND OF THE INVENTION

Field of the Invention

The invention relates to a logic cell, and more particularly to a logic cell with diffusion break (DB) structure.

Description of the Related Art

Integrated circuits (ICs) have become increasingly important. Applications using ICs are used by millions of people. These applications include cell phones, smartphones, tablets, laptops, notebook computers, PDAs, wireless email terminals, MP3 audio and video players, and portable wireless web browsers. Integrated circuits increasingly include powerful and efficient on-board data storage and logic circuitry for signal control and processing.

With the increasing down-scaling of integrated circuits, the integrated circuits become more compact. For standard cells that are frequently used in integrated circuits, when the number of standard cells is increased, the chip area is increased. Therefore, a standard cell with a smaller area and better efficiency is desired.

BRIEF SUMMARY OF THE INVENTION

Semiconductor structures are provided. An embodiment of a semiconductor structure is provided. The semiconductor structure includes a semiconductor substrate and a logic cell with a logic function. The logic cell includes a plurality of first transistors in an active region over the semiconductor substrate, a second transistor in the active region, a third transistor in the active region, a first isolation structure and a second isolation structure on opposite edges of the active region and extending along the first direction. Each of the first transistors includes a first gate electrode extending along the first direction. The second transistor includes a second gate electrode extending along the first direction. The third transistor includes a third gate electrode extending along the first direction. The first gate electrodes are disposed between the first and second isolation structures. The second gate electrode is disposed between the first gate electrodes and the first isolation structure. The third gate electrode is disposed between the first gate electrodes and the second isolation structure. The first and second isolation structures and the first gate electrode have a first length in the first direction. The second and third gate electrodes have a second length in the first direction. The second length is shorter than the first length.

Furthermore, an embodiment of a semiconductor structure is provided. The semiconductor structure includes a semiconductor substrate and a logic cell with a first logic function and a second logic function. The logic cell includes at least one first transistor in an active region over the semiconductor substrate, at least one second transistor in the active region, a first isolation structure disposed on a first edge of the active region and extending along the first direction, and a second isolation structure disposed on a second edge of the active region and extending along the first direction. The first transistor includes a first gate electrode extending along the first direction, and the first transistor is configured to perform the first logic function. The second transistor includes a second gate electrode extending along the first direction, wherein the second transistor is configured to perform the second logic function. The first gate electrode is disposed between the first isolation structure and the second gate electrode, and the second gate electrode is disposed between the first gate electrode and the second isolation structure. The first edge of the active region is opposite the second edge of the active region.

Moreover, an embodiment of a semiconductor structure is provided. The semiconductor structure includes a semiconductor substrate and a logic cell with a logic function. The logic cell includes a plurality of P-type transistors in a first active region over the semiconductor substrate, a plurality of N-type transistors in a second active region over the semiconductor substrate, a first isolation structure and a second isolation structure on opposite edges of the first active region and opposite edges of the second active region, a first transistor in the first active region and between the first isolation structure and the P-type transistors, a second transistor in the first active region and between the second isolation structure and the P-type transistors, a third transistor in the second active region and between the first isolation structure and the N-type transistors, and a fourth transistor in the second active region and between the second isolation structure and the N-type transistors. Each of the P-type transistors includes a first gate electrode extending along the first direction. Each of the N-type transistors shares the first gate electrode with a respective P-type transistor. The first and second isolation structures extend along the first direction. The first transistor includes a second gate electrode extending along the first direction. The second transistor includes a third gate electrode extending along the first direction. The first and third transistors share the second gate electrode. The second and fourth transistors share the third gate electrode. The P-type transistors and the N-type transistors are configured to perform the logic function.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures.

Figure 1:
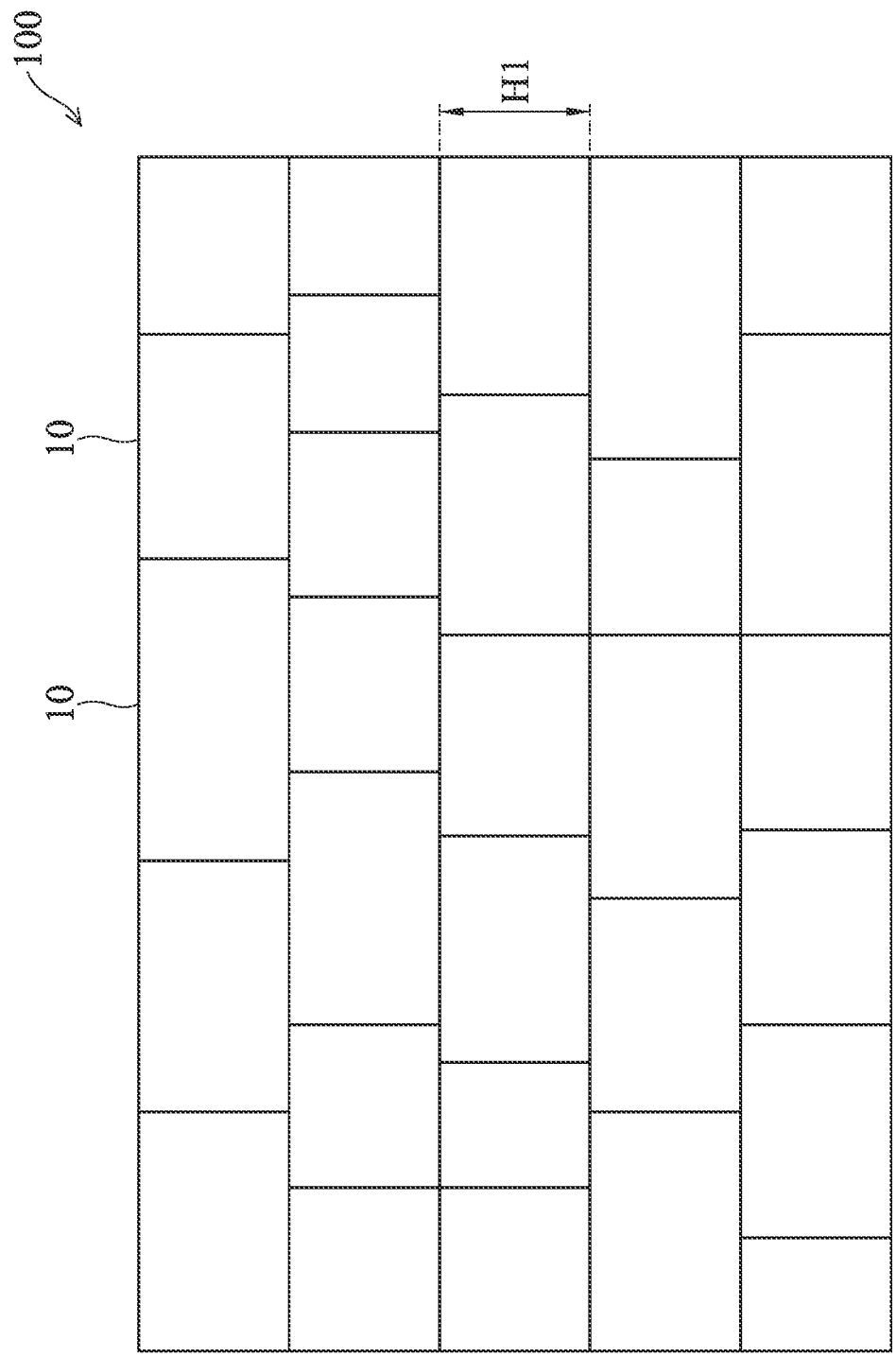
FIG. 1 shows a simplified diagram illustrating a cell array of an IC according to some embodiments of the invention.

FIG. 1 shows a simplified diagram illustrating a cell array 100 of an IC according to some embodiments of the invention. The cell array 100 includes multiple logic cells 10. In some embodiments, the logic cells 10 are the standard cells (e.g., INV (inverter), AND, OR, NAND, NOR, Flip-Flop, SCAN, etc.), a combination thereof or specific logic functional cells. Furthermore, the logic functions of the logic cells 10 may be the same or different. Furthermore, each of the logic cells 10 includes a plurality of transistors. In some embodiments, the logic cells 10 corresponding to the same function or operation may have the same circuit configuration with different semiconductor structures and/or different layouts. In FIG. 1, the logic cells 10 have the same cell height H1 (e.g., along the Y-direction) in the layout. Furthermore, the logic cells 10 may have the same or different cell widths (e.g., along X-direction) in the layout. It should be noted that the number and the configuration of the logic cells 10 are used as an example, and not to limit the invention.

In some embodiments, the transistors in the logic cells 10 are selected from a group consisting of planar transistors, fin field effect transistors (FinFETs), vertical gate all around (GAA), horizontal GAA, nano wire, nano sheet, or a combination thereof.

Figure 2:
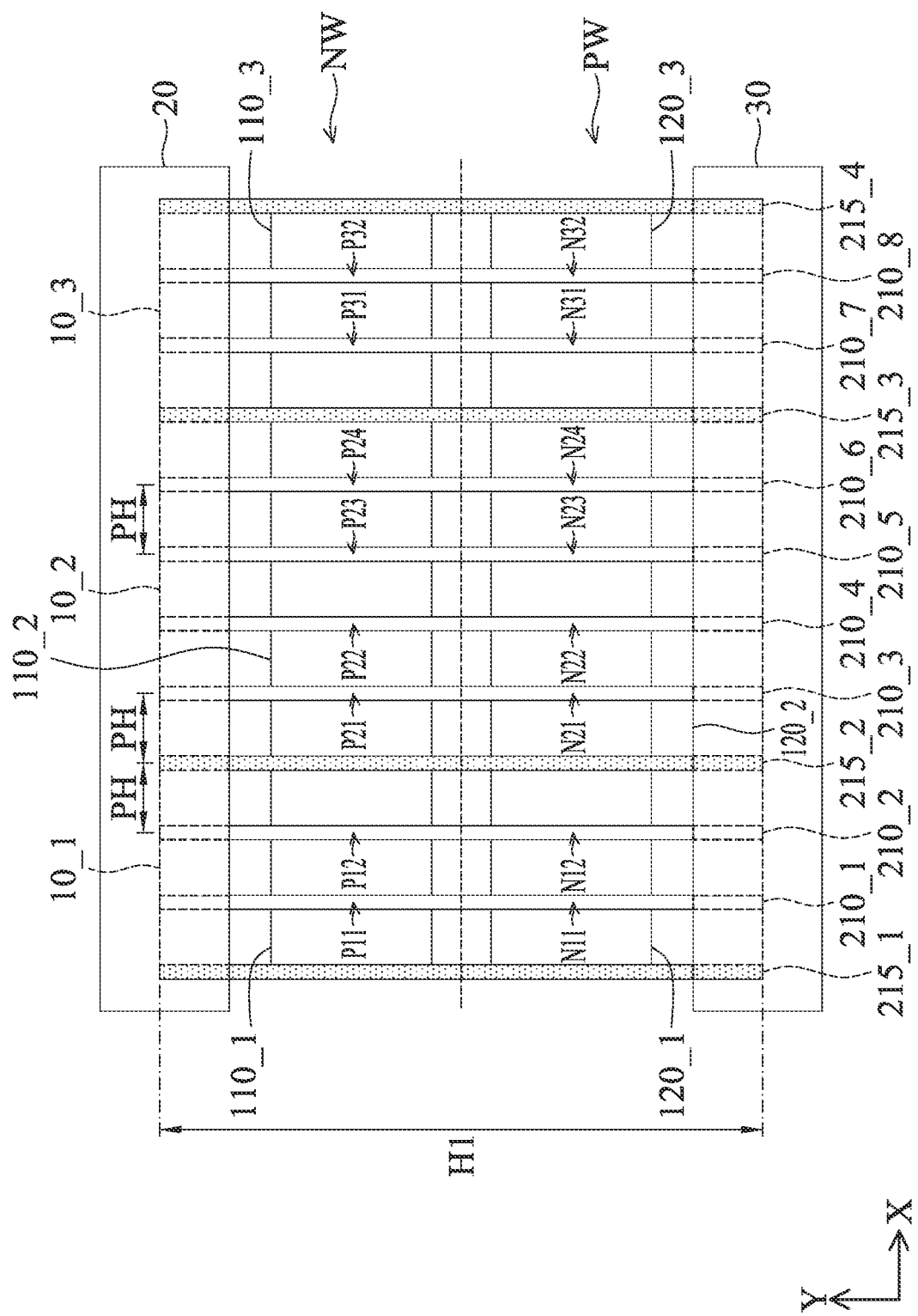
FIG. 2 shows a simplified diagram illustrating a row in the cell array of FIG. 1 according to some embodiments of the invention.

FIG. 2 shows a simplified diagram illustrating a row in the cell array 100 of FIG. 1 according to some embodiments of the invention. The logic cells 10_1, 10_2 and 10_3 are arranged in the same row and between a power line 20 (e.g., VDD line or a first power supply line) and a ground line 30 (e.g., VSS line or a second power supply line). Furthermore, the outer boundary of each of the logic cells 10_1, 10_2 and 10_3 is illustrated using dashed lines. The logic cells 10_1, 10_2 and 10_3 have the same cell height H1. In the cell array 100 of FIG. 1, the logic cells 10 in the same row are electrically isolated from each other by the isolation structures (or region). In other words, the active region of each logic cell 10 is separated from the active region of the adjacent logic cell 10 by the isolation structures. In some embodiments, the isolation structure may be the diffusion break (DB) structure. In some embodiment, the isolation structure may be the shallow trench isolation (STI). In some embodiments, the isolation structure may be the dielectric-base dummy gate. Compared with the continuous diffusion logic cell, the logic cells 10_1, 10_2 and 10_3 have smaller cell area (e.g., reducing the area by 10%) due to the smaller cell height and the narrower power/ground line.

In the logic cell 10_1, the gate structures 210_1 and 210_2 extending in the Y-direction forms the P-type transistors P11 and P12 in the active region 110_1 of the N-type well region NW and N-type transistors N11 and N12 in the active region 120_1 of the P-type well region PW. In the logic cell 10_2, the gate structures 210_3 through 210_6 extending in the Y-direction forms the P-type transistors P21 through P24 in the active region 110_2 of the N-type well region NW and N-type transistors N21 through N24 in the active region 120_2 of the P-type well region PW. In the logic cell 10_3, the gate structures 210_7 and 210_8 extending in the Y-direction forms the P-type transistors P31 and P32 in the active region 110_3 of the N-type well region NW and N-type transistors N31 and N32 in the active region 120_3 of the P-type well region PW. In order to simplify the description, detail of the gate structures 210_1 through 210_8, such as the gate dielectric, the gate electrode and so on, and corresponding source/drain regions, will be omitted.

The P-type transistors P11 and P12 and the N-type transistors N11 and N12 are configured to perform a first logic function for the logic cell 10_1. The P-type transistors P21 through P24 and the N-type transistors N21 through N24 are configured to perform a second logic function for the logic cell 10_2. The P-type transistors P31 and P32 and the N-type transistors N31 and N32 are configured to perform a third logic function for the logic cell 10_3. In some embodiments, the first, second and third logic functions are different. For example, the logic cell 10_1 is an inverter (NOT gate), the logic cell 10_2 is a NAND gate, and the logic cell 10_3 is an NOR gate. In some embodiments, the first, second and third logic functions are the same. For example, the logic cells 10_1, 10_2 and 10_3 are inverters with different driving strengths.

In FIG. 2, the isolation structures 215_1 and 215_2 are arranged in the boundary of the logic cell 10_1, the isolation structures 215_2 and 215_3 are arranged in the boundary of the logic cell 10_2, and the isolation structures 215_3 and 215_4 are arranged in the boundary of the logic cell 10_3. In other words, the active regions 110_1 and 120_1 of the logic cell 10_1 are separated from the active regions 110_2 and 120_2 of logic cell 10_2 by the isolation structure 215_2. Furthermore, the active regions 110_2 and 120_2 of logic cell 10_2 are separated from the active regions 110_3 and 120_3 of logic cell 10_2 by the isolation structure 215_3.

In the logic cells 10_1 through 10_3, the gate structures are arranged between the isolation structures with a fixed pitch PH. For example, the gate structures 210_3 through 210_6 are arranged in sequence from the isolation structure 215_2 to the isolation structure 215_3 according to the pitch PH. Furthermore, the pitch between the isolation structure 215_2 and the gate structure 210_2 is equal to the isolation structure 215_2 and the gate structure 210_3, i.e., the pitch PH.

In some embodiments, the gate structures 210_1 through 210_8 and the isolation structures 215_1 through 215_4 have the same length (e.g., H1) in the Y-direction. In some embodiments, the gate structures 210_1 through 210_8 and the isolation structures 215_1 through 215_4 have the same width in the X-direction. Moreover, the gate structures 210_1 through 210_8 and the isolation structures 215_1 through 215_4 are formed under and partially covered by the power line 20 and the ground line 30.

In some embodiments, each of the gate structures 210_1 through 210_8 may be the continuous poly, and each of the isolation structures 215_1 through 215_4 may be the continuous poly on diffusion edge.

Figure 3A:
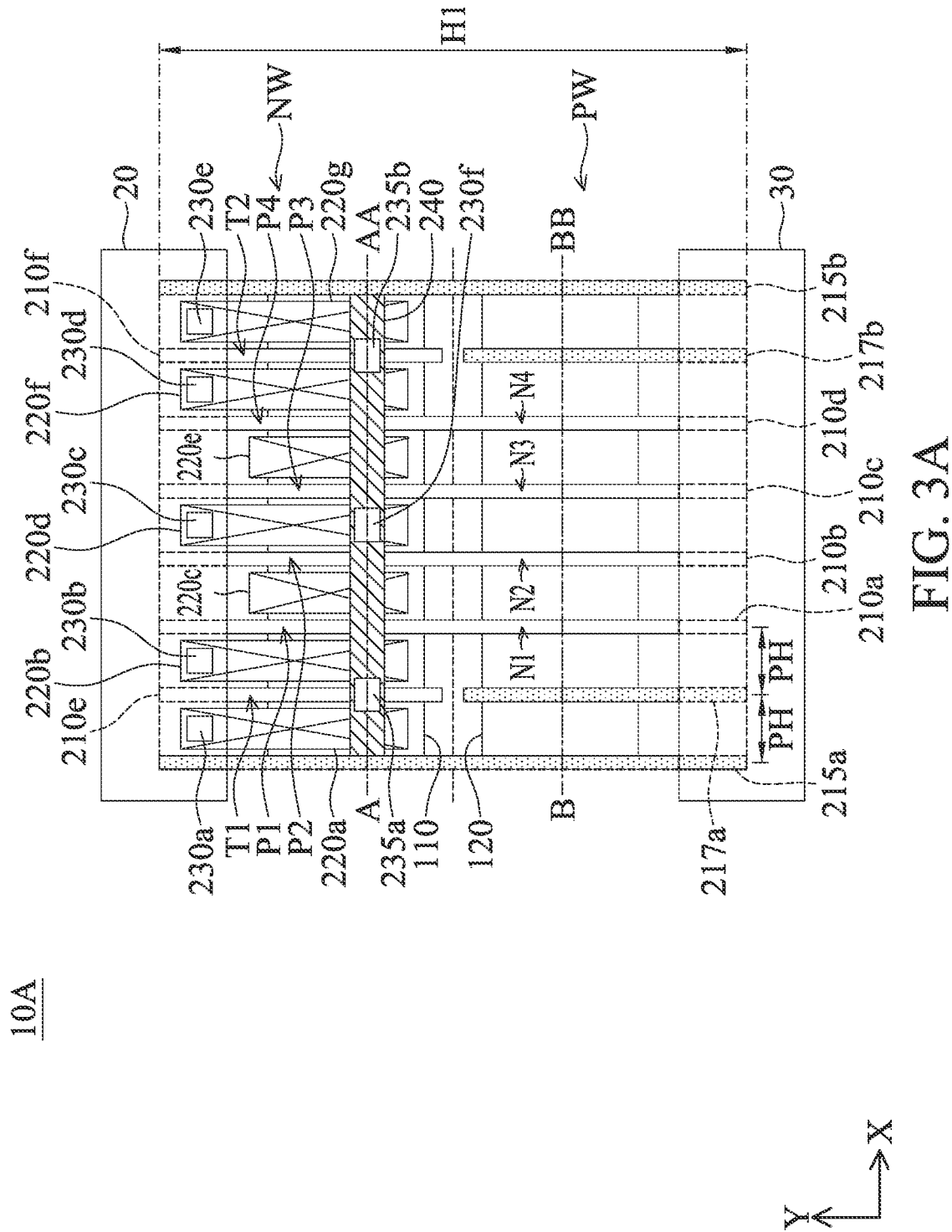
FIG. 3A shows a simplified diagram illustrating a logic cell according to some embodiments of the invention.

FIG. 3A shows a simplified diagram illustrating a logic cell 10A according to some embodiments of the invention. The logic cell 10A is capable of providing a specific logic function with small cell delay. The logic cell 10A is arranged between the power line 20 and the ground line 30, and has a cell height H1. Furthermore, the outer boundary of the logic cell 10A is illustrated using dashed lines.

In the logic cell 10A, the gate structures 210a through 210d extending in the Y-direction forms the P-type transistors P1 through P4 in the active region 110 of the N-type well region NW. Moreover, the gate structures 210a through 210d forms N-type transistors N1 through N4 in the active region 120 of the P-type well region PW. The P-type transistors P1 through P4 and the N-type transistors N1 through N4 are configured to perform the specific logic function for the logic cell 10A.

Compared with the logic cells 10_1, 10_2 and 10_3 of FIG. 2, the logic cell 10A further includes the tie-gate transistors T1 and T2. Each of the tie-gate transistors T1 and T2 is a dummy P-type transistor that has the source region and drain region both coupled to its gate. The gate structures 210e and 210f extending in the Y-direction form the tie-gate transistors T1 and T2 in the active region 110 of the N-type well region NW. It should be noted that the gate structures 210e and 210f only extends above the N-type well region NW, and does not extend above the P-type well region PW. Therefore, the gate structures 210e and 210f are shorter than the gate structures 210a through 210d.

In FIG. 3A, the connection features 220a through 220g extending in the Y-direction are positioned over the active region 110. The connection features 220a through 220g are formed in the same layer over the active region 110. In some embodiments, each of the connection features 220a through 220g is a contact for connecting the source/drain region of the transistor. Furthermore, the connection features 230a through 230f are positioned in the logic cell 10A. The connection features 230a through 230f are formed over the connection features 220a through 220g. In some embodiments, each of the connection features 230a through 230f is a via for connecting the corresponding contact. Moreover, the connection features 235a and 235b are positioned in the logic cell 10A. The connection features 235a and 235b and the connection features 230a through 230f are formed in the same layer. In some embodiments, each of the connection features 235a and 235b is a via for connecting the corresponding gate structure. Furthermore, the materials of the connection features 235a and 235b, the connection features 230a through 230f and the connection features 220a through 220g are selected from a group consisting of Ti, TiN, TaN, Co, Ru, Pt, Ni, W, Al, Cu, or a combination thereof. In some embodiments, the connection features 235a and 235b, the connection features 230a through 230f and the connection features 220a through 220g are formed by the same material. In some embodiments, the connection features 235a and 235b, the connection features 230a through 230f and the connection features 220a through 220g are formed by different materials.

The isolation structures 215a and 215b extending in the Y-direction are arranged in the boundary of the logic cell 10A. The gate structures 210a through 210d are surrounded (or sandwiched) by the isolation structures 215a and 215b. The gate structure 210e is disposed (or inserted) between the isolation structure 215a and the gate structure 210a, and the gate structure 210f is disposed (or inserted) between the isolation structure 215b and the gate structure 210d.

In the logic cell 10A, the gate structures 210a through 210f are arranged between the isolation structures 215a and 215b with a fixed pitch PH. For example, the gate structures 210e, 210a through 210d and 210f are arranged in sequence from the isolation structure 215a to the isolation structure 215b according to the pitch PH.

The active regions 110 and 120 of the logic unit 10A are defined by the isolation structures 215a and 215b along the X-direction. For example, the isolation structure 215a is disposed on the left edges of the active regions 110 and 120, and the isolation structure 215b is disposed on the right edges of the active regions 110 and 120. In other words, the isolation structures 215a and 215b are arranged on the opposite edges of the active regions 110 and 120. By inserting the gate structure 210e (i.e., the tie-gate transistor T1), the gate structure 210a (i.e., the P-type transistor P1) is far away from the left edge of the active region 110. Therefore, it is avoided that the diffusion break stress at the left edge of the active region 110 will degrade the saturation drain current (Idsat) of the P-type transistor P1, especially the P-type transistor with SiGe channel. Moreover, by inserting the gate structure 210f (i.e., the tie-gate transistor T2), the gate structure 210d (i.e., the P-type transistor P4) is far away from the right edge of the active region 110. Therefore, it is avoided that the diffusion break stress at the right edge of the active region 110 will degrade the saturation drain current (Idsat) of the P-type transistor P4, especially the P-type transistor with SiGe channel.

In the logic cell 10A, a dielectric-base gate structure 217a extending in the Y-direction is disposed between the gate structure 210a and the isolation structure 215a and over the active region 120. Moreover, a dielectric-base gate structure 217b extending in the Y-direction is disposed between the gate structure 210d and the isolation structure 215b and over the active region 120. It should be noted that the dielectric-base gate structures 217a and 217b only extends above the P-type well region PW, and does not extend above the N-type well region NW. Therefore, the dielectric-base gate structures 217a and 217b are shorter than the gate structures 210a through 210d. In some embodiments, the dielectric-base gate structures 217a and 217b and the gate structures 210e and 210f have the same length.

In some embodiments, on the interface between the N-type well region NW and the P-type well region PW, the dielectric-base gate structures 217a and 217b are formed by performing a cut metal gate (CMG) process or a cut poly (CPO) process on the gate structures 210e and 210f that have the same length as the gate structures 210a through 210d. Next, the gate features of the gate structures 210e and 210f over the P-type well region are replaced with the dielectric-base material.

Figure 3B:
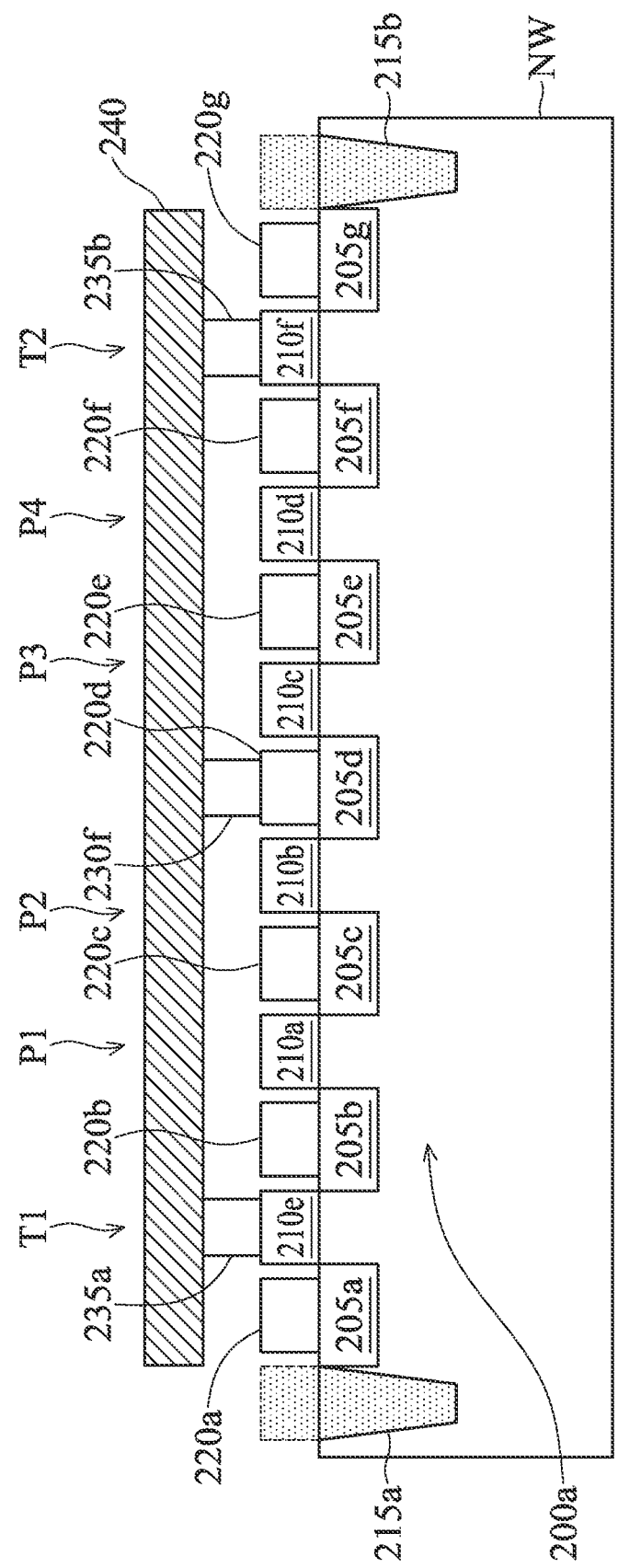
FIG. 3B shows a cross-sectional view of the semiconductor structure of the logic cell along line A-AA in FIG. 3A according to some embodiments of the invention.

FIG. 3B shows a cross-sectional view of the semiconductor structure of the logic cell 10A along line A-AA in FIG. 3A according to some embodiments of the invention. Referring to FIGS. 3A and 3B together, the N-type well region NW is formed over a substrate (not shown). In some embodiments, the substrate is a Si substrate. In some embodiments, the material of the substrate is selected from a group consisting of bulk-Si, SiP, SiGe, SiC, SiPC, Ge, SOI—Si, SOI—SiGe, III-VI material, or a combination thereof. In some embodiments, the N-type well region NW is an N-type substrate. A semiconductor fin 200a is formed on the N-type well region NW. Furthermore, the isolation structures 215a and 215b are arranged upon the left edge and right edge of the semiconductor fin 200a.

The connection feature 220a is formed between the isolation structure 215a and the gate structure 210e, and the source region 205a of the tie-gate transistor T1 is coupled to the power line 20 through the connection feature 220a and the connection feature 230a. The connection feature 220b is formed between the gate structures 210e and 210a, and the common source/drain region 205b of the tie-gate transistor T1 and the P-type transistor P1 is coupled to the power line 20 through the connection feature 220b and the connection feature 230b. The connection feature 220c is formed between the gate structures 210a and 210b, and the common source/drain region 205c of the P-type transistors P1 and P2 is coupled to the interconnect structure (not shown) through the connection feature 220c.

The connection feature 220g is formed between the isolation structure 215b and the gate structure 210f, and the source region 205g of the tie-gate transistor T2 is coupled to the power line 20 through the connection feature 220g and the connection feature 230e. The connection feature 220f is formed between the gate structures 210d and 210f, and the common source/drain region 205f of the tie-gate transistor T2 and the P-type transistor P4 is coupled to the power line 20 through the connection feature 220f and the connection feature 230d. The connection feature 220e is formed between the gate structures 210c and 210d, and the common source/drain region 205e of the P-type transistors P3 and P4 is coupled to the interconnect structure (not shown) through the connection feature 220e.

The connection feature 220d is formed between the gate structures 210b and 210c, and the common source/drain region 205d of the P-type transistors P2 and P3 is coupled to the power line 20 through the connection feature 220d and the connection feature 230c. Furthermore, the connection feature 220d is further coupled to the metal line 240 extending in the X-direction through the connection feature 230f. The metal line 240 is coupled to the gate structures 210e and 210f through the connection feature 235a and 235b, respectively. In some embodiments, the metal line 240, the power line 20 and the ground line 30 are formed in the same metal line.

For the tie-gate transistor T1, the source region 205a is coupled to the power line 20 through the connection features 220a and 230a. Moreover, the drain region 205b is coupled to the power line 20 through the connection features 220b and 230b. Furthermore, the gate structure 210e is coupled to the power line 20 through the metal line 240 and the connection features 220d, 230c, 230f and 235a. Similarly, for the tie-gate transistor T2, the source region 205g is coupled to the power line 20 through the connection features 220g and 230e. Moreover, the drain region 205f is coupled to the power line 20 through the connection features 220f and 230d. Furthermore, the gate structure 210f is coupled to the power line 20 through the metal line 240 and the connection features 220d, 230c, 230f and 235b. Thus, the drain, gate and source regions of the tie-gate transistors T1 and T2 are coupled to the power line 20 through a first-type of interconnect structure formed by the metal line 240 and the corresponding connection features (e.g., 235a, 235b and 230f). In other words, the tie-gate transistors T1 and T2 cannot provide the specific logic function for the logic unit 10A.

Figure 3C:
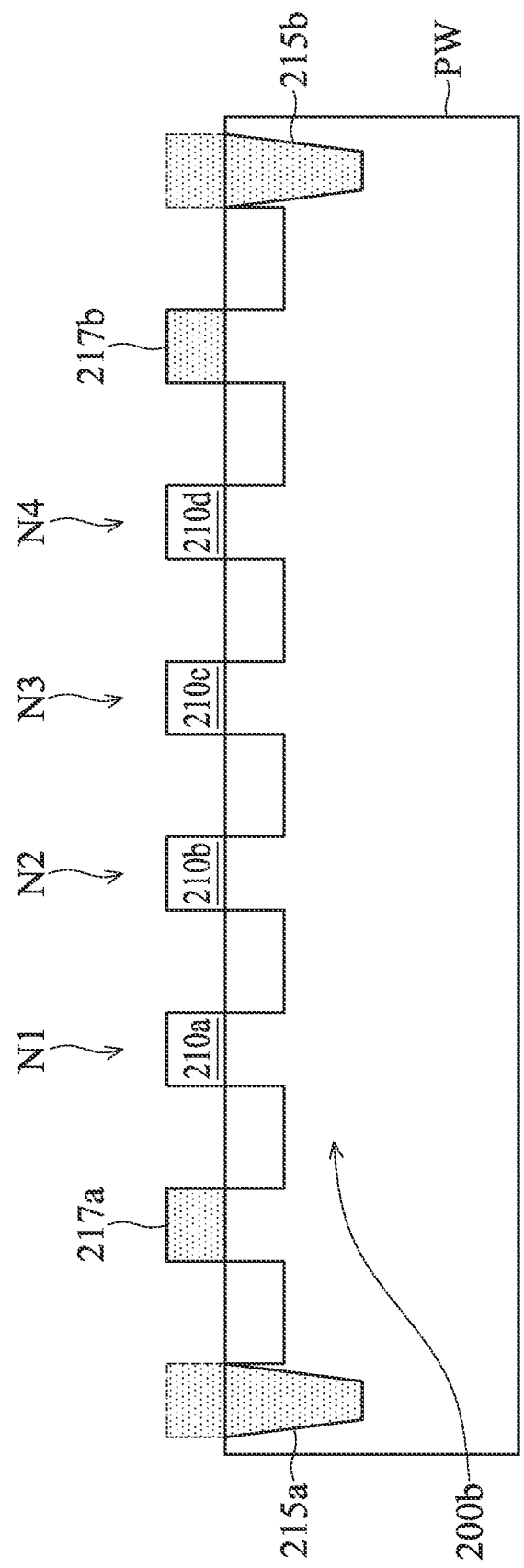
FIG. 3C shows a cross-sectional view of the semiconductor structure of the logic cell along line B-BB in FIG. 3A according to some embodiments of the invention.

FIG. 3C shows a cross-sectional view of the semiconductor structure of the logic cell 10A along line B-BB in FIG. 3A according to some embodiments of the invention. Referring to FIGS. 3A and 3C together, a semiconductor fin 200b is formed on the P-type well region PW. Furthermore, the isolation structures 215a and 215b are arranged upon the left edge and right edge of the semiconductor fin 200b. In order to simplify the description, the connection features for connecting the source/drain regions of the N-type transistors N1 through N4 are omitted.

In FIG. 3C, the dielectric-base dummy gate 217a is formed between the gate structure 210a and the isolation structure 215a, and the dielectric-base dummy gate 217b is formed between the gate structure 210d and the isolation structure 215b. The lower surfaces of the isolation structures 215a and 215b are lower than the lower surfaces of the dielectric-base dummy gates 217a and 217b. Furthermore, the depth of the isolation structures 215a and 215b is greater than that of the dielectric-base dummy gates 217a and 217b. In some embodiments, the upper surfaces of the dielectric-base dummy gates 217a and 217b are level with the upper surfaces of the isolation structures 215a and 215b. In some embodiments, the isolation structures 215a and 215b are formed by the STI, and the upper surfaces of the isolation structures 215a and 215b are level with the lower surfaces of the dielectric-base dummy gates 217a and 217b.

Figure 4:
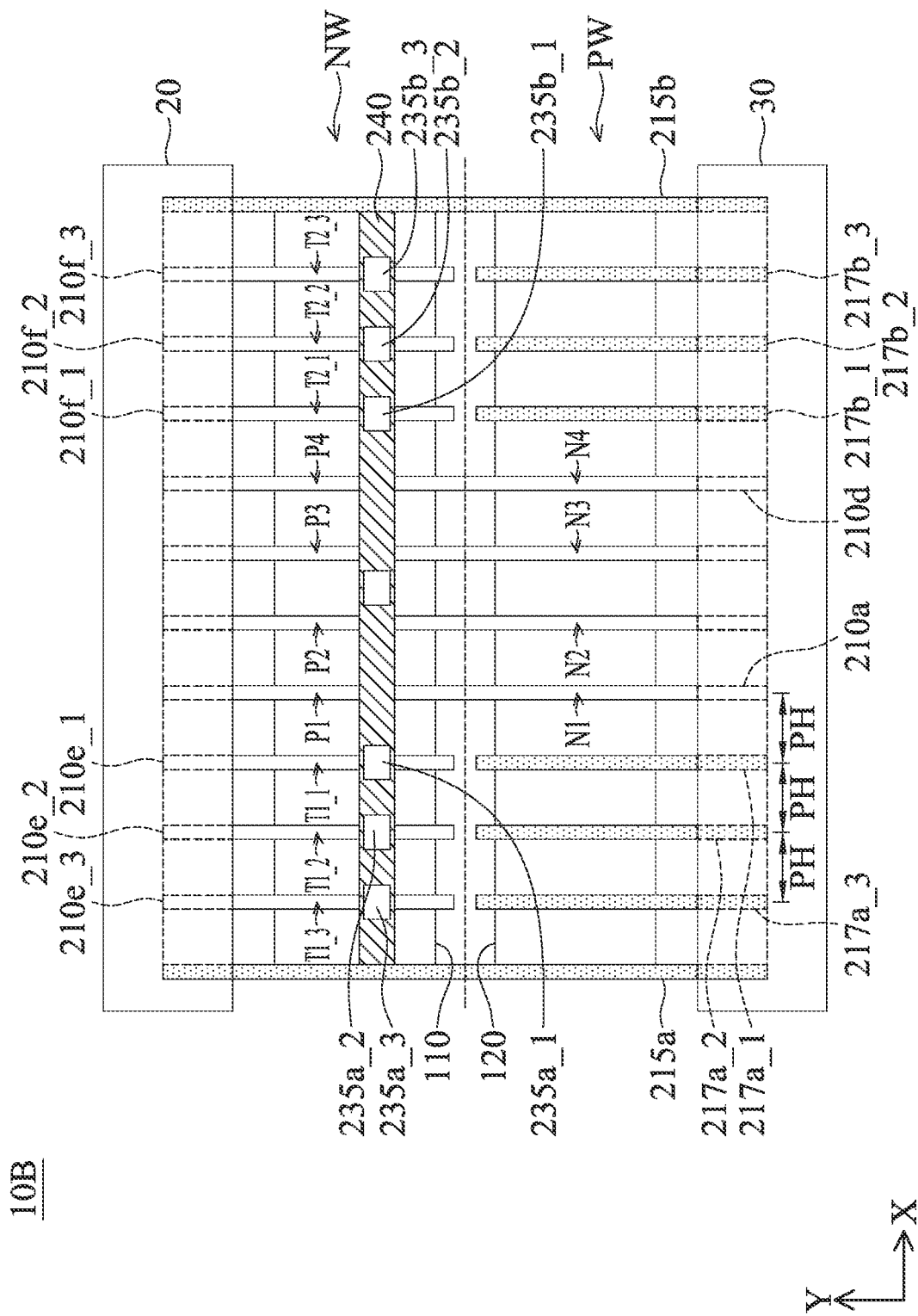
FIG. 4 shows a simplified diagram illustrating a logic cell according to some embodiments of the invention.

FIG. 4 shows a simplified diagram illustrating a logic cell 10B according to some embodiments of the invention. The outer boundary of the logic cell 10B is illustrated using dashed lines. The semiconductor structure of the logic cell 10B is similar to the semiconductor structure of the logic cell 10A of FIG. 3A, and the differences between FIG. 4 and FIG. 3A is that the logic cell 10B includes more tie-gate transistors T1_1 through T1_3 and more tie-gate transistors T2_1 through T2_3. In order to simplify the description, the connection features for connecting the source/drain regions of the transistors are omitted.

In FIG. 4, the gate structures 210e_1 through 210e_3 are disposed between the gate structure 210a and the isolation structure 215a over the active region 110, and the gate structures 210f_1 through 210f_3 are disposed between the gate structure 210d and the isolation structure 215b over the active region 110. Furthermore, the dielectric-base gate structures 217a_1 through 217a_3 are disposed between the gate structure 210a and the isolation structure 215a over the active region 120, and the dielectric-base gate structures 217b_1 through 217b_3 are disposed between the gate structure 210d and the isolation structure 215b over the active region 120. Moreover, the extended metal line 240 is coupled to the gate structures 210e_1 through 210e_3 and 210f_1 through 210f_1 via the connection feature 235a_1 through 235a_3 and 235b_1 through 235b_3, respectively.

It should be noted that the number of gate structures 210e_1 through 210e_3 and 210f_1 through 210f_3 and the corresponding dielectric-base gate structures 217a_1 through 217a_3 and 217b_1 through 217b_3 are used as an example, and not to limit the disclosure. In some embodiments, the number of gate structures 210e_1 through 210e_3 or 210f_1 through 210f_3 is greater than the number of gate structures 210a through 210d. In some embodiments, the number of gate structures 210e_1 through 210e_3 or 210f_1 through 210f_3 is equal to the number of gate structures 210a through 210d. In some embodiments, the number of gate structures 210e_1 through 210e_3 or 210f_1 through 210f_3 is lower than the number of gate structures 210a through 210d.

The logic cell 10B is capable of providing the specific logic function of the logic cell 10A with smaller cell delay since the distance between the P-type transistor P1 and the isolation structure 215a and the distance between the P-type transistor P4 and the isolation structure 215b are increased. Therefore, it is more avoided that the diffusion break stress at the left and right edges of the active region 110 will degrade the saturation drain current (Idsat) of the transistors in the logic cell 10A, especially the P-type transistors P1 and P4.

Figure 5:
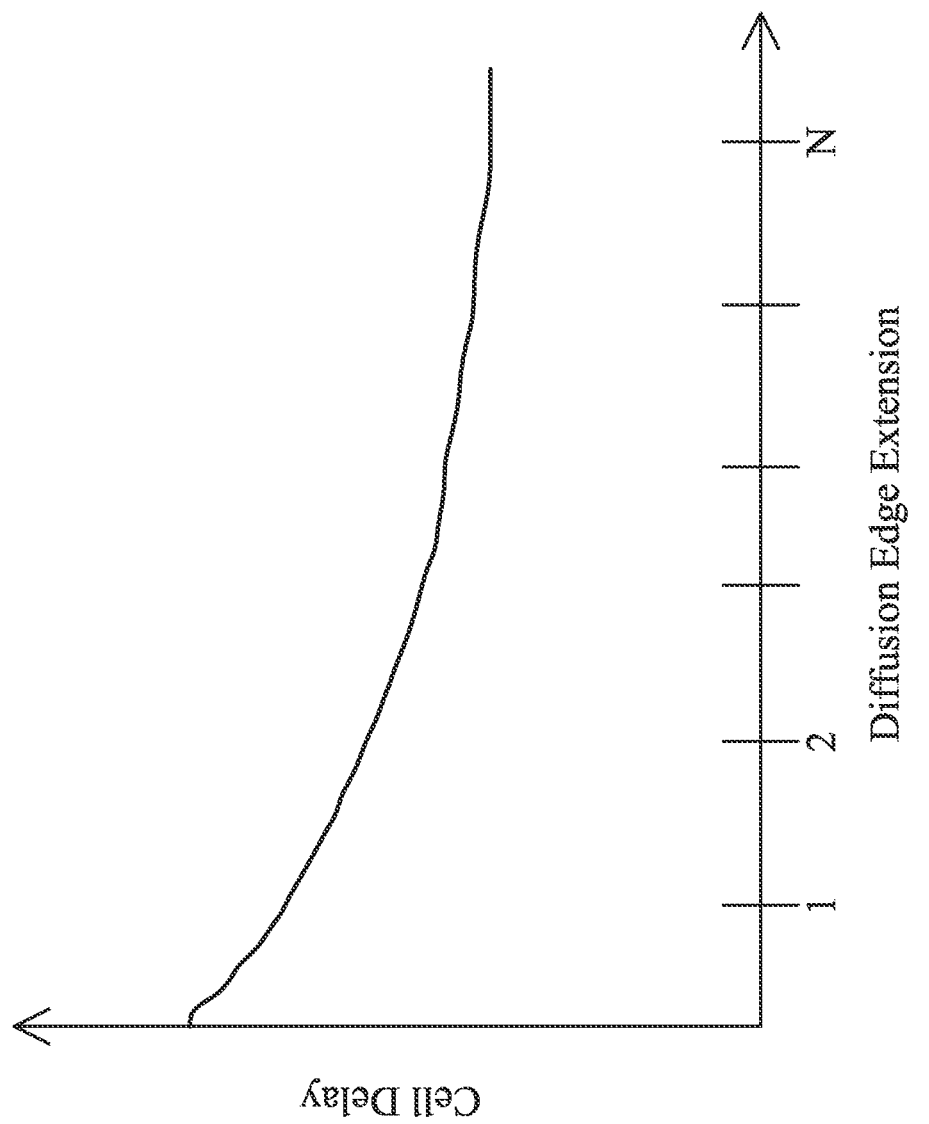
FIG. 5 shows a diagram illustrating the relationship between cell delay and diffusion edge extension according to some embodiments of the invention.

FIG. 5 shows a diagram illustrating the relationship between cell delay and diffusion edge extension according to some embodiments of the invention. By inserting more tie-gate transistors, the cell delay (e.g., delay time from input terminal to output terminal) of the logic cell is decreased when the diffusion edge extension is increased (i.e., the gate structures of the tie-gate transistors are increased).

Figure 6:
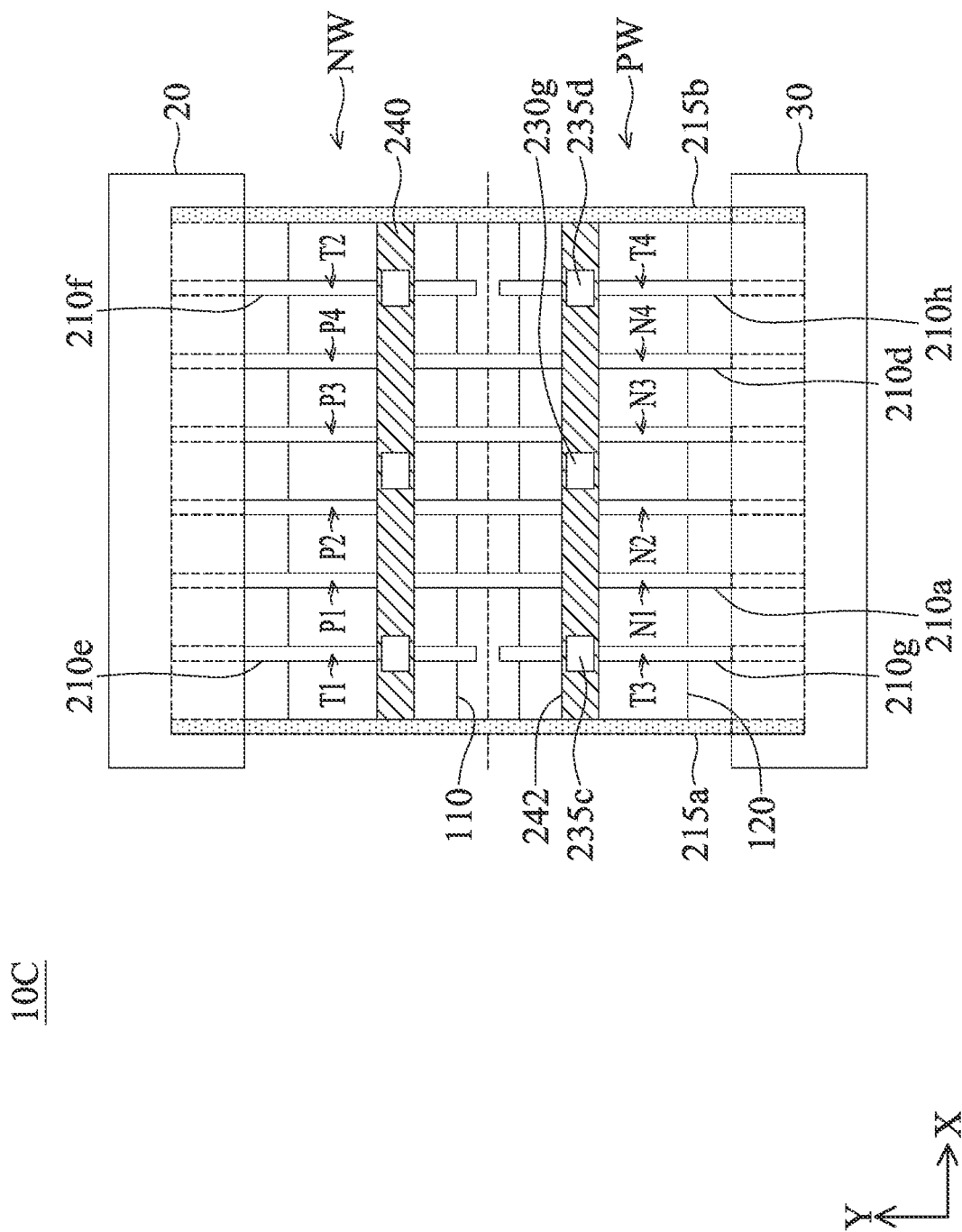
FIG. 6 shows a simplified diagram illustrating a logic cell according to some embodiments of the invention.

FIG. 6 shows a simplified diagram illustrating a logic cell 10C according to some embodiments of the invention. The outer boundary of the logic cell 10C is illustrated using dashed lines. The semiconductor structure of the logic cell 10C is similar to the semiconductor structure of the logic cell 10A of FIG. 3A, and the differences between FIG. 6 and FIG. 3A is that the logic cell 10C further includes the tie-gate transistors T3 and T4 over the active region 120. In order to simplify the description, the connection features for connecting the source/drain regions of the transistors are omitted.

In FIG. 6, the gate structure 210g is disposed between the gate structure 210a and the isolation structure 215a and the gate structure 210h is disposed between the gate structure 210d and the isolation structure 215b over the active region 120. In other words, no dielectric-base gate structure is disposed in the logic cell 10C. Furthermore, the metal line 242 is coupled to the gate structures 210g and 210h via the connection feature 235c and 235d, respectively. Similarly, the metal line 242 is further coupled to the ground line 30 through the connection feature 230g and the corresponding connection feature (not shown), such as the contact of the common source/drain region of the N-type transistors N2 and N3. Furthermore, the source regions and the drain regions of the tie-gate transistors T3 and T4 are coupled to the ground line 30 through the corresponding features (not shown). Thus, each of the tie-gate transistors T3 and T4 form a dummy N-type transistor that has the source region and drain region both coupled to its gate.

The logic cell 10C is capable of providing the specific logic function of the logic cell 10A with smaller cell delay since more tie-gate transistors (e.g., the transistors T3 and T4) are used. Therefore, it is more avoided that the diffusion break stress at the left and right edges of the active regions 110 and 120 will degrade the saturation drain current (Idsat) of the transistors in the logic cell 10C, especially the P-type transistors P1 and P4 and the N-type transistors N1 and N4.

Figure 7A:
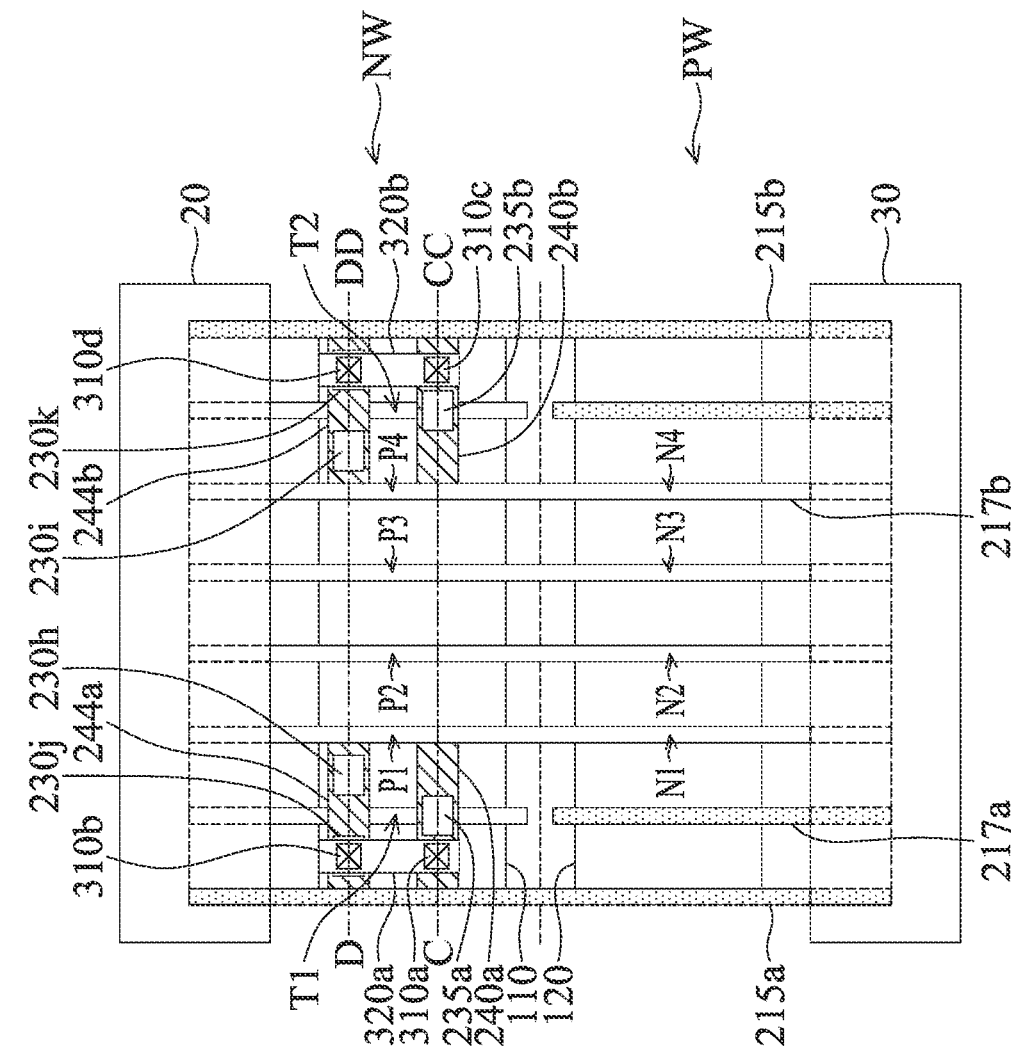
FIG. 7A shows a simplified diagram illustrating a logic cell according to some embodiments of the invention.

FIG. 7A shows a simplified diagram illustrating a logic cell 10D according to some embodiments of the invention. The outer boundary of the logic cell 10D is illustrated using dashed lines. The logic cell 10D is capable of providing a the specific logic function similar to that of the logic cell 10A of FIG. 3A. The semiconductor structure of the logic cell 10D is similar to the semiconductor structure of the logic cell 10A of FIG. 3A, and the differences between FIG. 7A and FIG. 3A is that the drain, gate and source regions of the tie-gate transistors T1 and T2 are coupled to the power line 20 through a second-type of interconnect structures. In order to simplify the description, the connection features for connecting the source/drain regions of the transistors are omitted.

Figure 7B:
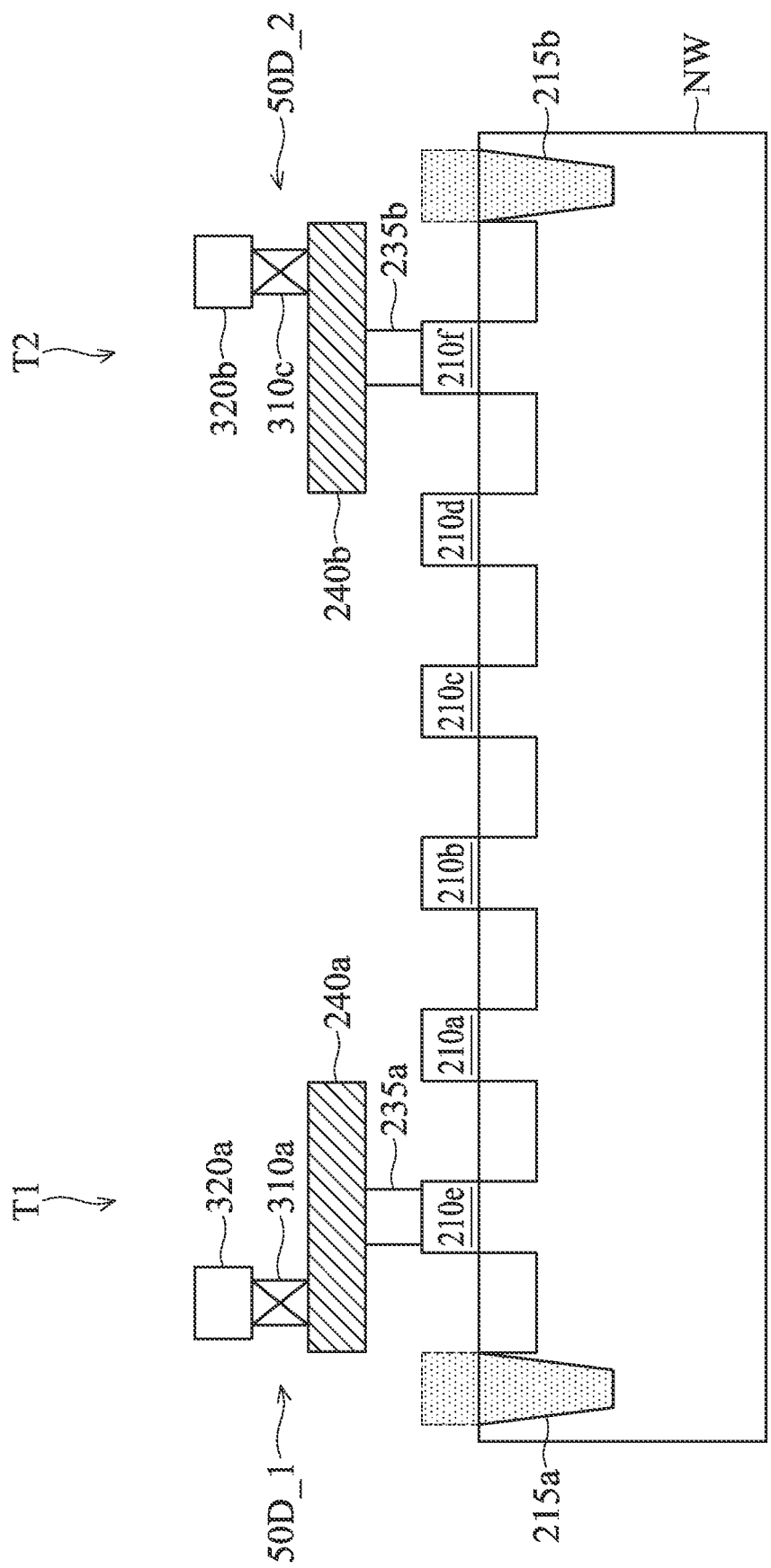
FIG. 7B shows a cross-sectional view of the semiconductor structure of the logic cell along line C-CC in FIG. 7A according to some embodiments of the invention.

FIG. 7B shows a cross-sectional view of the semiconductor structure of the logic cell 10D along line C-CC in FIG. 7A according to some embodiments of the invention. Referring to FIGS. 7A and 7B together, the gate structure 210e of the tie-gate transistor T1 is coupled to the metal line 240a extending in the X-direction through the connection feature 235a, and the metal line 240a is further coupled to the metal line 320a extending in the Y-direction through the connection feature 310a. Furthermore, the gate structure 210f of the tie-gate transistor T2 is coupled to the metal line 240b extending in the X-direction through the connection feature 235b, and the metal line 240b is further coupled to the metal line 320b extending in the Y-direction through the connection feature 310c. The metal lines 240a and 240b are formed in a first metal layer, and the metal lines 320a and 320b are formed in a second metal layer over the first metal layer. Furthermore, the metal line 240a is separated from the metal line 240b. Moreover, the length of the metal lines 240a and 240b is less than twice the pitch PH.

Figure 7C:
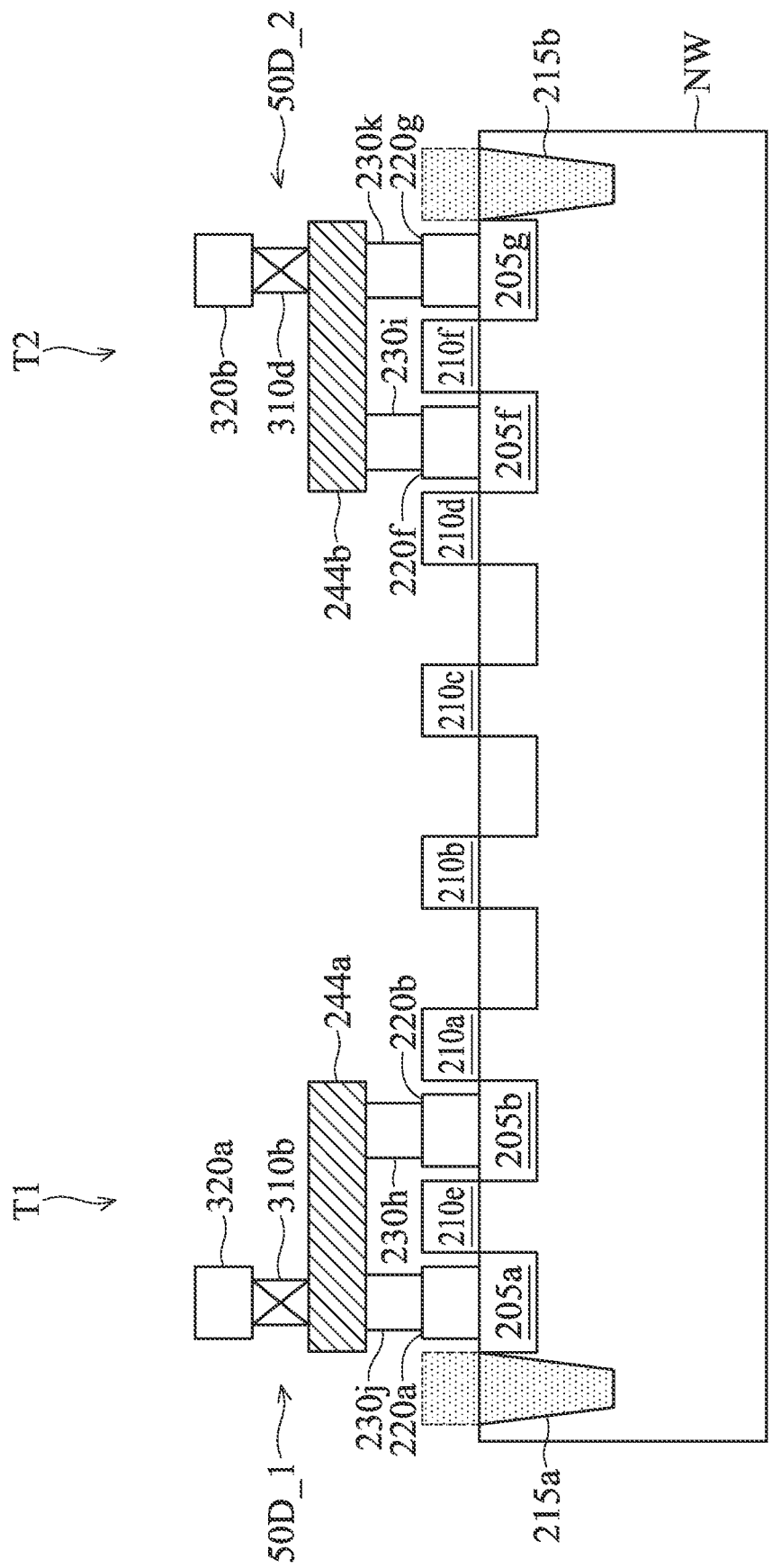
FIG. 7C shows a cross-sectional view of the semiconductor structure of the logic cell along line D-DD in FIG. 7A according to some embodiments of the invention.

FIG. 7C shows a cross-sectional view of the semiconductor structure of the logic cell 10D along line D-DD in FIG. 7A according to some embodiments of the invention. Referring to FIGS. 7A and 7C together, the source region 205a of the tie-gate transistor T1 is coupled to the metal line 244a extending in the X-direction through the connection features 220a and 230j, and the drain region 205b of the tie-gate transistor T1 is coupled to the metal line 244a through the connection features 220*b* and 230*h*. Moreover, the source region 205*g* of the tie-gate transistor T2 is coupled to the metal line 244*b* extending in the X-direction through the connection features 220*g* and 230*k*, and the drain region 205*f* of the tie-gate transistor T2 is coupled to the metal line 244*b* through the connection features 220*f* and 230*i*.

In the logic cell 10D, the metal line 244*a* is further coupled to the metal line 320*a* through the connection feature 310*b*, and the metal line 244*b* is further coupled to the metal line 320*b* through the connection feature 310*d*. Thus, the drain, gate and source regions of the tie-gate transistor T1 are coupled to the power line 20 through the second-type of interconnect structure 50D_1 formed by the metal lines 240*a*, 320*a* and 244*a* and the corresponding connection features. Moreover, the drain, gate and source regions of the tie-gate transistor T2 are coupled to the power line 20 through the second-type of interconnect structure 50D_2 formed by the metal lines 240*b*, 320*b* and 244*b* and the corresponding connection features. In some embodiments, the second-type of interconnect structures 50D_1 and 50D_2 are mirrored in the Y-direction in layout.

Figure 8:
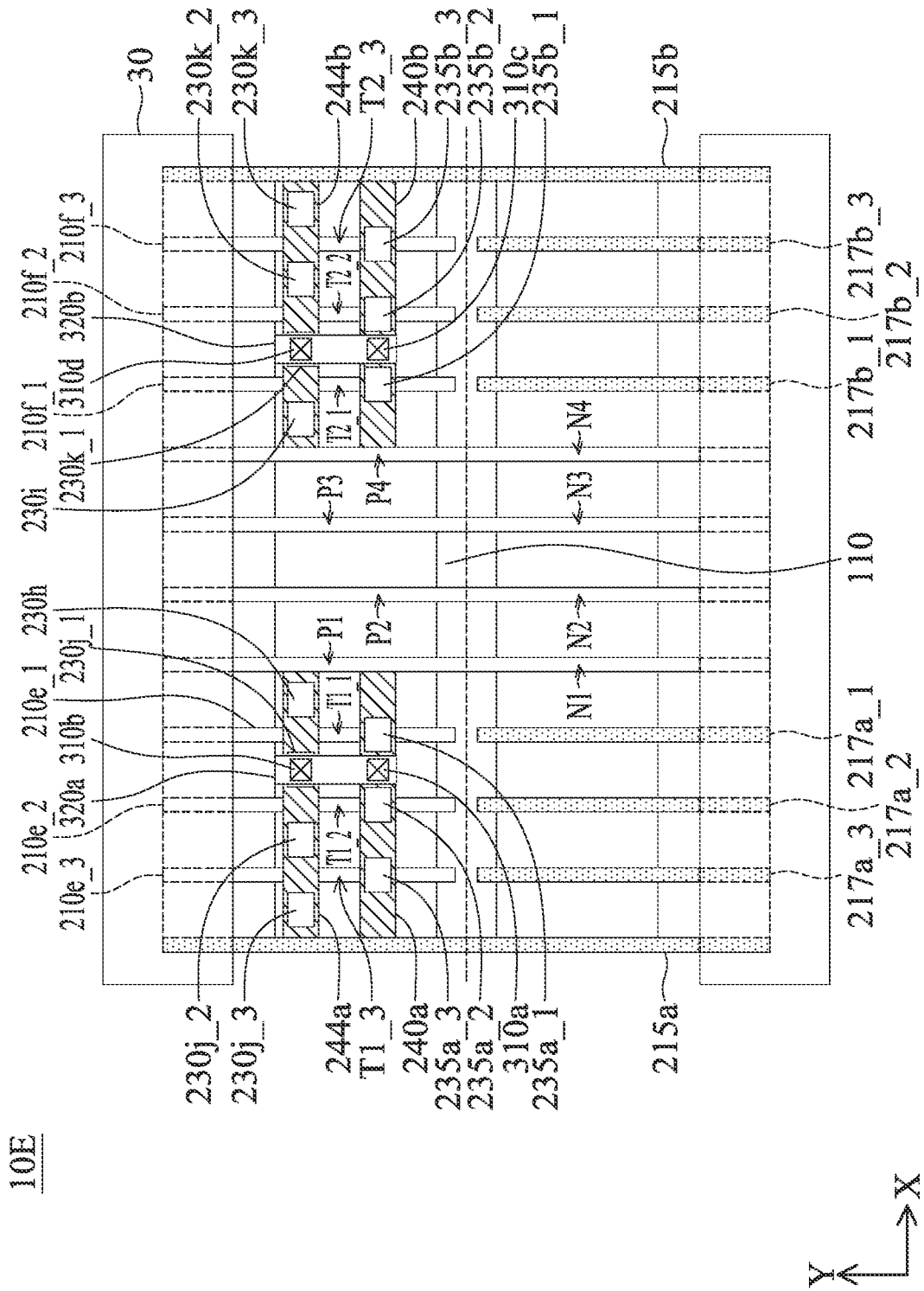
FIG. 8 shows a simplified diagram illustrating a logic cell according to some embodiments of the invention.

FIG. 8 shows a simplified diagram illustrating a logic cell 10E according to some embodiments of the invention. The outer boundary of the logic cell 10E is illustrated using dashed lines. The semiconductor structure of the logic cell 10E is similar to the semiconductor structure of the logic cell 10D of FIG. 7A, and the differences between FIG. 8 and FIG. 7A is that the logic cell 10E includes more tie-gate transistors T1_1 through T1_3 and more tie-gate transistors T2_1 through T2_3.

In FIG. 8, the extended metal line 240*a* is coupled to the gate structures 210*e*_1 through 210*e*_3 via the connection feature 235*a*_1 through 235*a*_3, respectively. The extended metal line 240*b* is coupled to the gate structures 210*f*_1 through 210*f*_3 of the tie-gate transistors T2_1 through T2_3 via the connection feature 235*b*_1 through 235*b*_3, respectively. Furthermore, the extended metal line 244*a* is coupled to the source/drain regions of the tie-gate transistors T1_1 through T1_3 via the connection feature 230*j*_1 through 230*j*_3 and 230*h*. The extended metal line 244*b* is coupled to the source/drain regions of the tie-gate transistors T2_1 through T2_3 via the connection feature 230*k*_1 through 230*k*_3 and 230*i*.

The logic cell 10E is capable of providing the specific logic function of the logic cell 10D with small cell delay since the distance between the P-type transistor P1 and the isolation structure 215*a* and the distance between the P-type transistor P4 and the isolation structure 215*b* are increased. Therefore, it is more avoided that the diffusion break stress at the left and right edges of the active region-110 will degrade the saturation drain current (Idsat) of the transistors in the logic cell 10E, especially the P-type transistors P1 and P4.

Figure 9:
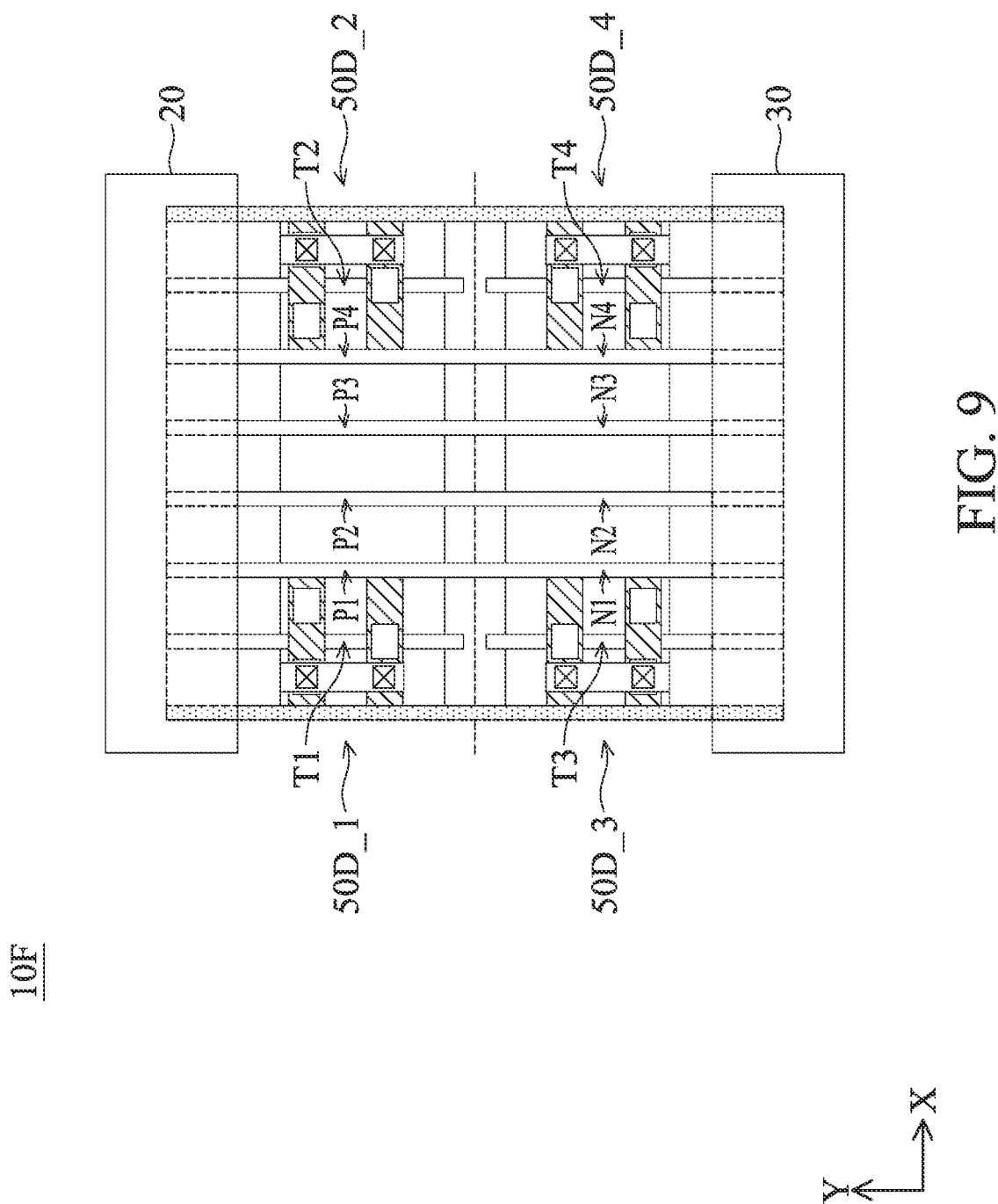
FIG. 9 shows a simplified diagram illustrating a logic cell according to some embodiments of the invention.

FIG. 9 shows a simplified diagram illustrating a logic cell 10F according to some embodiments of the invention. The outer boundary of the logic cell 10F is illustrated using dashed lines. The semiconductor structure of the logic cell 10F is similar to the semiconductor structure of the logic cell 10D of FIG. 7A, and the differences between FIG. 9 and FIG. 7A is that the logic cell 10F further includes the tie-gate transistors T3 and T4 over the active region 120.

In FIG. 9, the drain, gate and source regions of the tie-gate transistor T3 are coupled to the ground line 30 through the second-type of interconnect structure 50D_3. Moreover, the drain, gate and source regions of the tie-gate transistor T4 are coupled to the ground line 30 through the second-type of interconnect structure 50D_4. Thus, each of the tie-gate transistors T3 and T4 form a dummy N-type transistor that has the source region and drain region both coupled to its gate. In some embodiments, the second-type of interconnect structures 50D_1 and 50D_3 are mirrored in the X-direction, and the second-type of interconnect structures 50D_2 and 50D_4 are mirrored in the X-direction.

The logic cell 10F is capable of providing the specific logic function of the logic cell 10D with small cell delay since more tie-gate transistors (e.g., the transistors T3 and T4) are used. Therefore, it is more avoided that the diffusion break stress at the left and right edges of the active regions 110 and 120 will degrade the saturation drain current (Idsat) of the transistors in the logic cell 10F, especially the P-type transistors P1 and P4 and the N-type transistors N1 and N4.

Figure 10A:
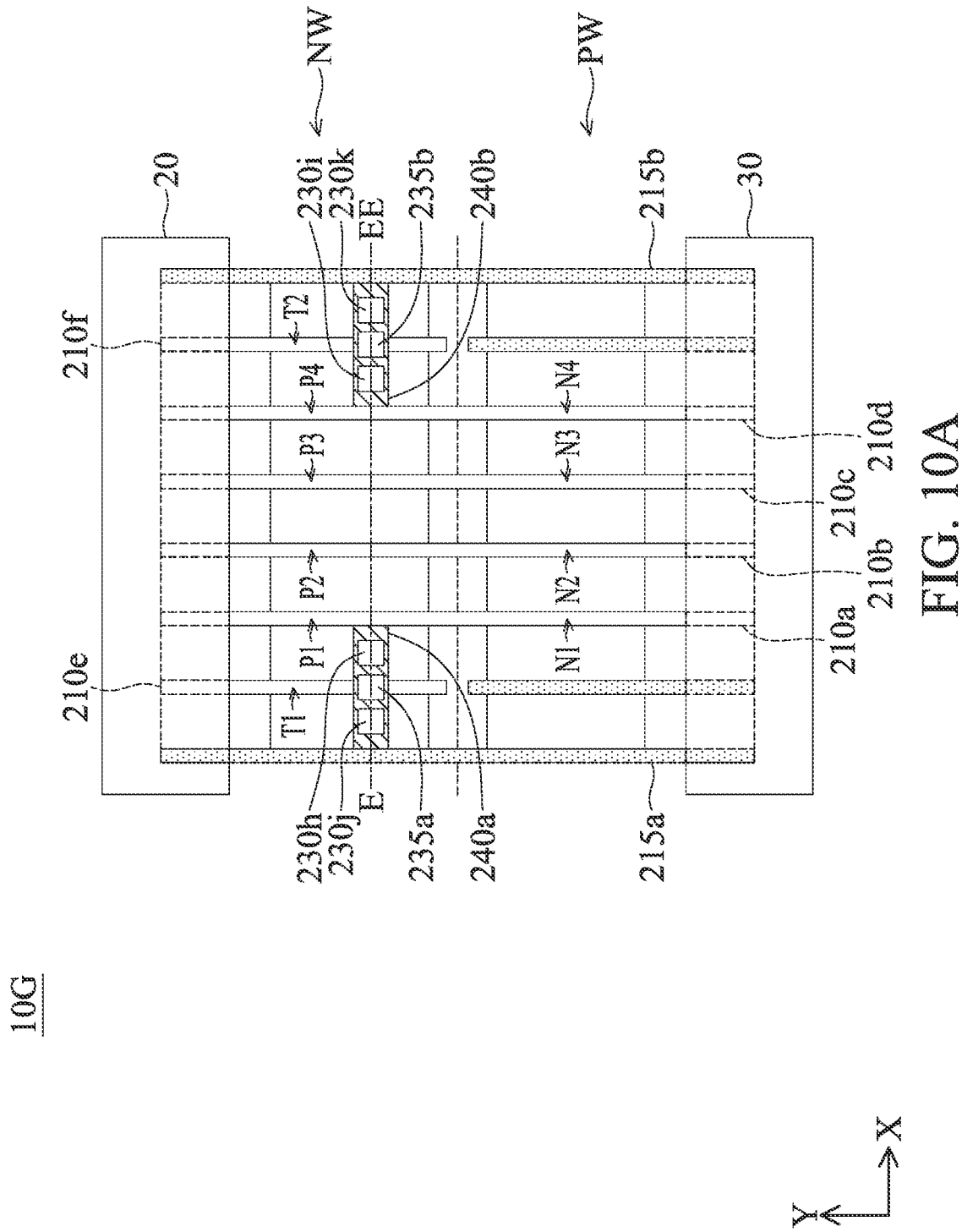
FIG. 10A shows a simplified diagram illustrating a logic cell according to some embodiments of the invention.

FIG. 10A shows a simplified diagram illustrating a logic cell 10G according to some embodiments of the invention. The outer boundary of the logic cell 10G is illustrated using dashed lines. The logic cell 10G is capable of providing a specific logic function similar to that of the logic cell 10A of FIG. 3A. The semiconductor structure of the logic cell 10G is similar to the semiconductor structure of the logic cell 10A of FIG. 3A, and the differences between FIG. 10A and FIG. 3A is that the drain, gate and source regions of the tie-gate transistors T1 and T2 are coupled to the power line 20 through a third-type of interconnect structures. In order to simplify the description, the connection features for connecting the source/drain regions of the transistors are omitted.

Figure 10B:
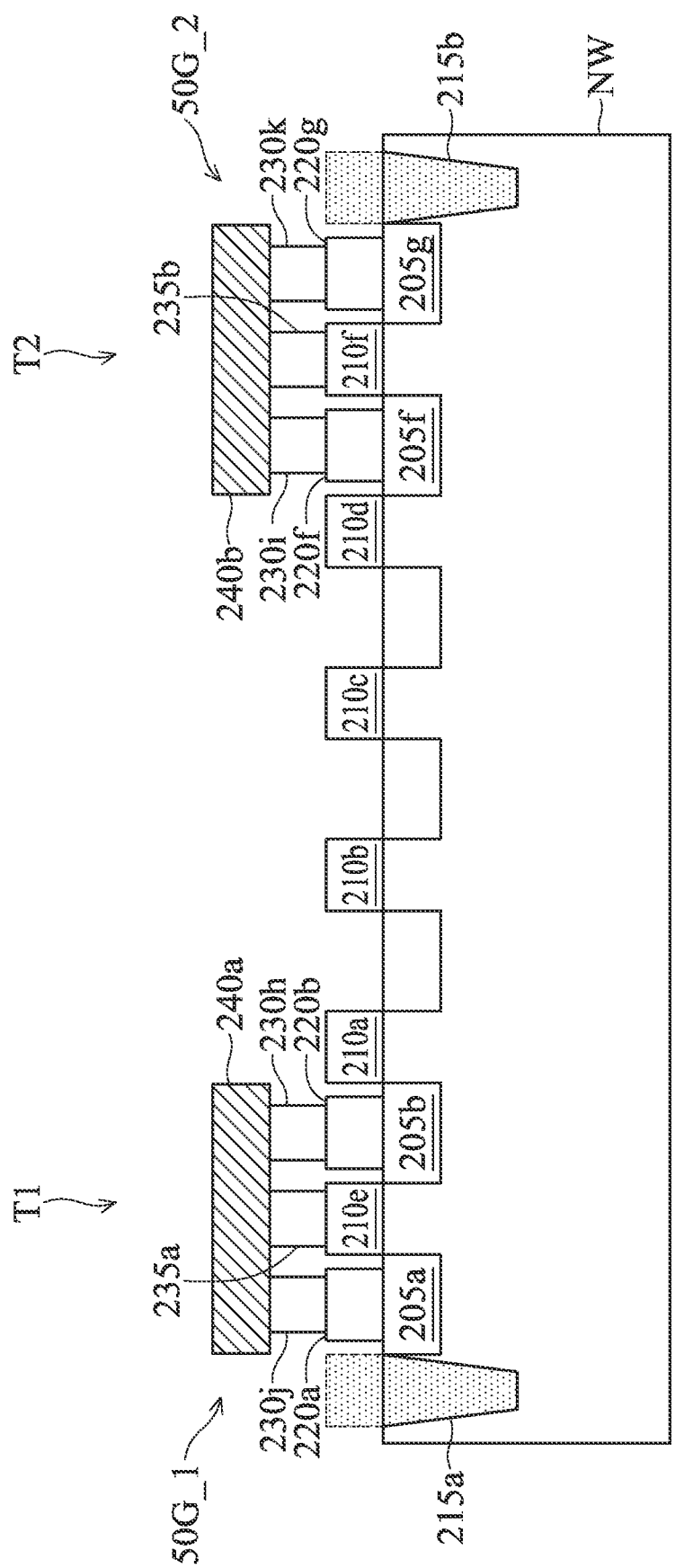
FIG. 10B shows a cross-sectional view of the semiconductor structure of the logic cell along line E-EE in FIG. 10A according to some embodiments of the invention.

FIG. 10B shows a cross-sectional view of the semiconductor structure of the logic cell 10G along line E-EE in FIG. 10A according to some embodiments of the invention. Referring to FIGS. 10A and 10B together, the gate structure 210*e* of the tie-gate transistor T1 is coupled to the metal line 240*a* through the connection feature 235*a*, and the gate structure 210*f* of the tie-gate transistor T2 is coupled to the metal line 240*b* through the connection feature 235*b*. The metal line 240*a* extends in the X-direction between the isolation structure 215*a* and the gate structure 210*a*, and the metal line 240*b* extends in the X-direction between the isolation structure 215*b* and the gate structure 210*d*. The source region 205*a* of the tie-gate transistor T1 is coupled to the metal line 240*a* through the connection features 220*a* and 230*j*, and the drain region 205*b* of the tie-gate transistor T1 is coupled to the metal line 240*a* through the connection features 220*b* and 230*h*. Moreover, the source region 205*g* of the tie-gate transistor T2 is coupled to the metal line 240*b* through the connection features 220*g* and 230*k*, and the drain region 205*f* of the tie-gate transistor T2 is coupled to the metal line 240*b* through the connection features 220*f* and 230*i*. Thus, the drain, gate and source regions of the tie-gate transistor T1 are coupled to the power line 20 through the third-type of interconnect structure 50G 1 formed by the metal line 240*a* and the corresponding connection features. The drain, gate and source regions of the tie-gate transistor T2 are coupled to the power line 20 through the third-type of interconnect structure 50G_2 formed by the metal line 240*b* and the corresponding connection features.

In some embodiments, the third-type of interconnect structures 50G 1 and 50G_2 are mirrored in the Y-direction. In some embodiments, the space between the connection features 230*b*, 230*j*, 230*i* and 230*k* and the connection features 235*a* and 235*b* are determined according to the process rules.

Figure 11:
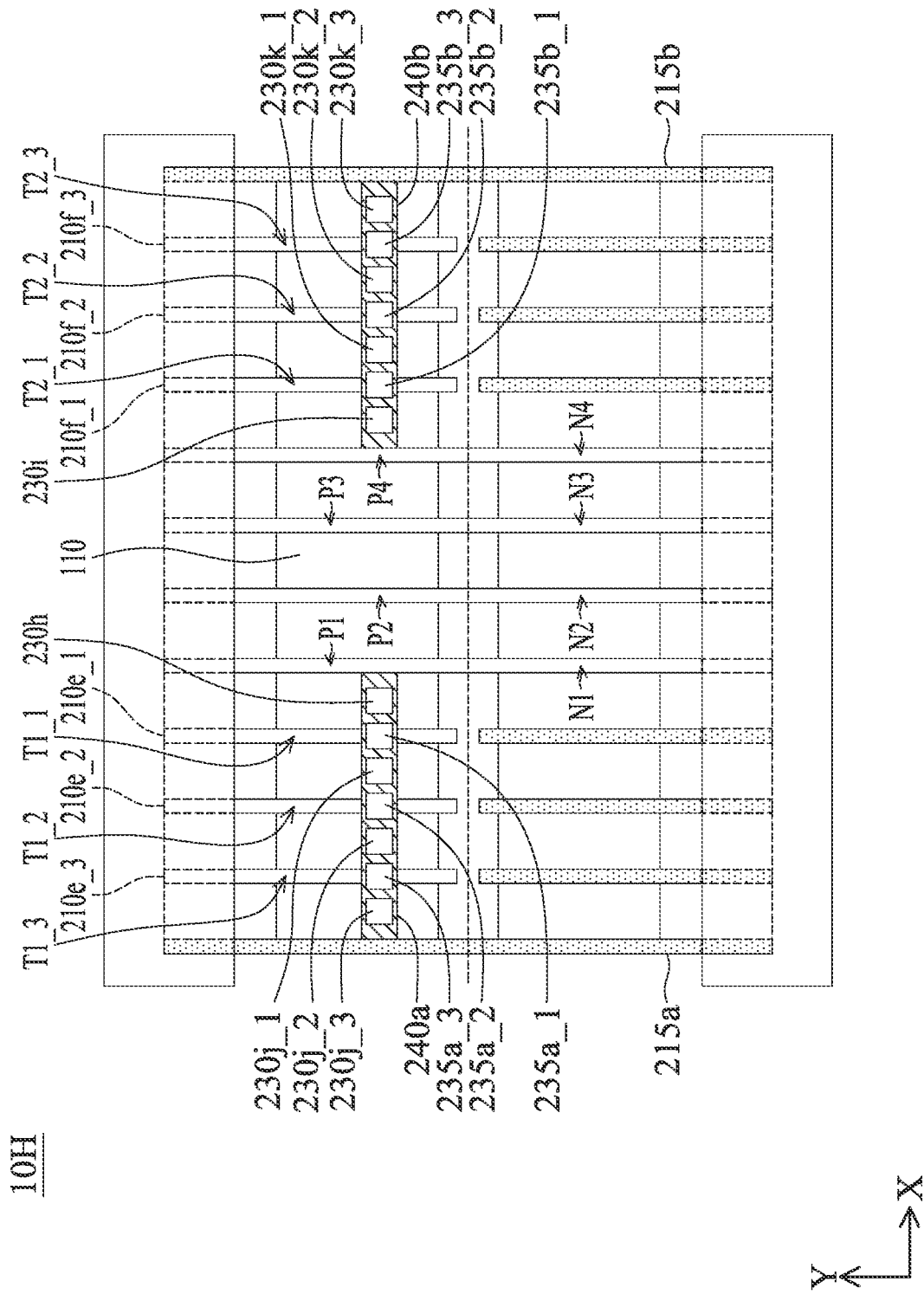
FIG. 11 shows a simplified diagram illustrating a logic cell according to some embodiments of the invention.

FIG. 11 shows a simplified diagram illustrating a logic cell 10H according to some embodiments of the invention. The outer boundary of the logic cell 10H is illustrated using dashed lines. The semiconductor structure of the logic cell 10H is similar to the semiconductor structure of the logic cell 10G of FIG. 10A, and the differences between FIG. 11 and FIG. 10A is that the logic cell 10H includes more tie-gate transistors T1_1 through T1_3 and more tie-gate transistors T2_1 through T2_3.

In FIG. 11, the extended metal line 240a is coupled to the gate structures 210e_1 through 210e_3 via the connection feature 235a_1 through 235a_3, respectively. The extended metal line 240b is coupled to the gate structures 210f_1 through 210f_3 of the tie-gate transistors T2_1 through T2_3 via the connection feature 235b_1 through 235b_3, respectively. Furthermore, the extended metal line 240a is further coupled to the source/drain regions of the tie-gate transistors T1_1 through T1_3 via the connection feature 230j_1 through 230j_3 and 230h. The extended metal line 240b is further coupled to the source/drain regions of the tie-gate transistors T2_1 through T2_3 via the connection feature 230k_1 through 230k_3 and 230i.

The logic cell 10H is capable of providing the specific logic function of the logic cell 10G with smaller cell delay since the distance between the P-type transistor P1 and the isolation structure 215a and the distance between the P-type transistor P4 and the isolation structure 215b are increased. Therefore, it is more avoided that the diffusion break stress at the left and right edges of the active region-110 will degrade the saturation drain current (Idsat) of the transistors in the logic cell 10H, especially the P-type transistors P1 and P4.

Figure 12:
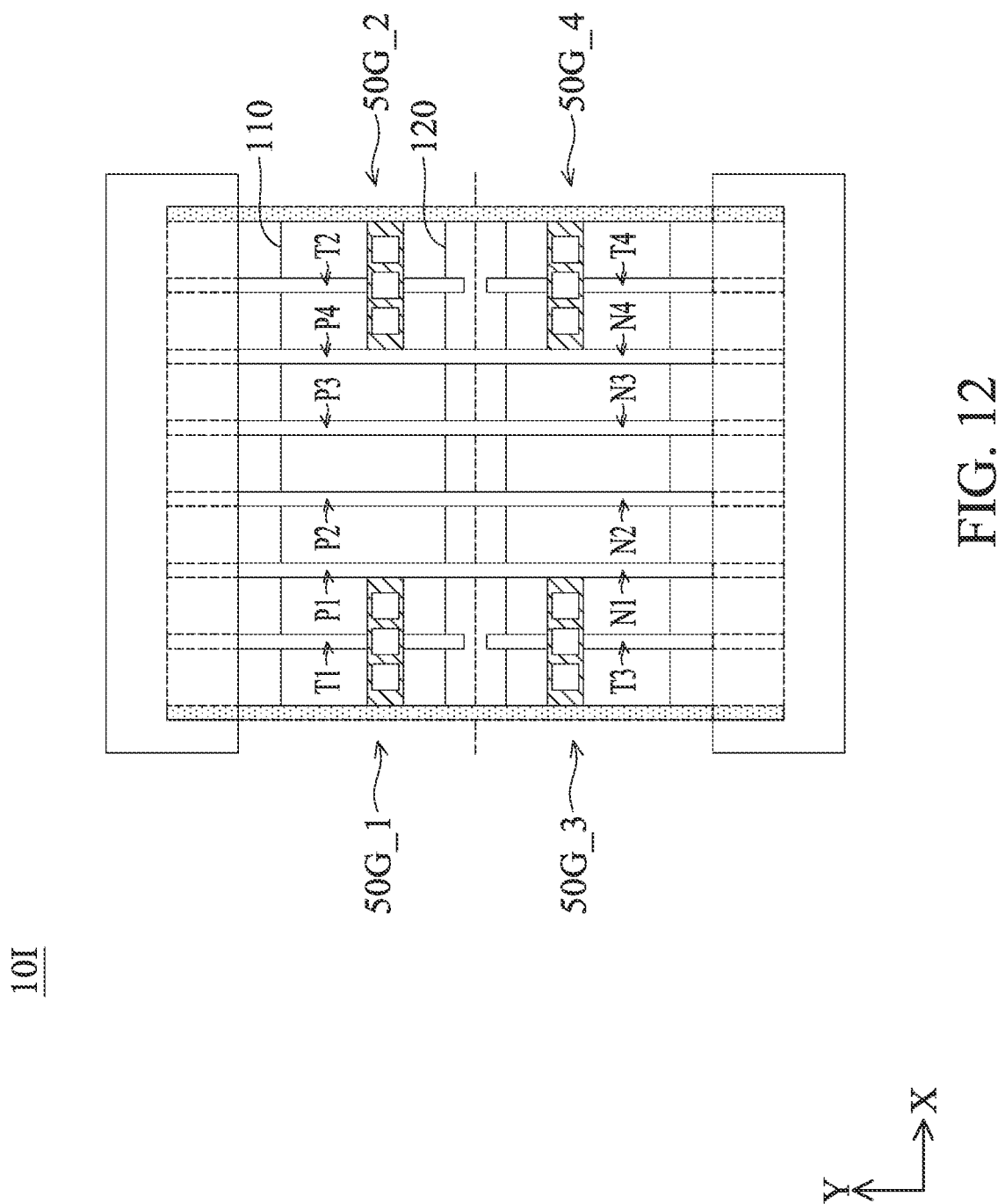
FIG. 12 shows a simplified diagram illustrating a logic cell according to some embodiments of the invention.

FIG. 12 shows a simplified diagram illustrating a logic cell 10I according to some embodiments of the invention. The outer boundary of the logic cell 10I is illustrated using dashed lines. The semiconductor structure of the logic cell 10I is similar to the semiconductor structure of the logic cell 10G of FIG. 10A, and the differences between FIG. 12 and FIG. 10A is that the logic cell 10I further includes the tie-gate transistors T3 and T4 over the active region 120.

In FIG. 12, the drain, gate and source regions of the tie-gate transistor T3 are coupled to the ground line 30 through the third-type of interconnect structure 50G_3. Moreover, the drain, gate and source regions of the tie-gate transistor T4 are coupled to the ground line 30 through the third-type of interconnect structure 50G_4. Thus, each of the tie-gate transistors T3 and T4 form a dummy N-type transistor that has the source region and drain region both coupled to its gate. In some embodiments, the third-type of interconnect structures 50G_1 and 50G_3 are mirrored in the X-direction, and the third-type of interconnect structures 50G_2 and 50G_4 are mirrored in the X-direction.

The logic cell 10I is capable of providing the specific logic function of the logic cell 10G with smaller cell delay since more tie-gate transistors (e.g., the transistors T3 and T4) are used. Therefore, it is more avoided that the diffusion break stress at the left and right edges of the active regions 110 and 120 will degrade the saturation drain current (Idsat) of the transistors in the logic cell 10I, especially the P-type transistors P1 and P4 and the N-type transistors N1 and N4.

Figure 13A:
FIG. 13A shows a simplified diagram illustrating a logic cell according to some embodiments of the invention.

FIG. 13A shows a simplified diagram illustrating a logic cell 10J according to some embodiments of the invention. The outer boundary of the logic cell 10J is illustrated using dashed lines. The logic cell 10J is capable of providing a specific logic function similar to that of the logic cell 10A of FIG. 3A. The semiconductor structure of the logic cell 10J is similar to the semiconductor structure of the logic cell 10A of FIG. 3A, and the differences between FIG. 13A and FIG. 3A is that the drain, gate and source regions of the tie-gate transistors T1 and T2 are coupled to the power line 20 through the fourth-type of interconnect structures. In order to simplify the description, the connection features for connecting the source/drain regions of the transistors are omitted.

Figure 13B:
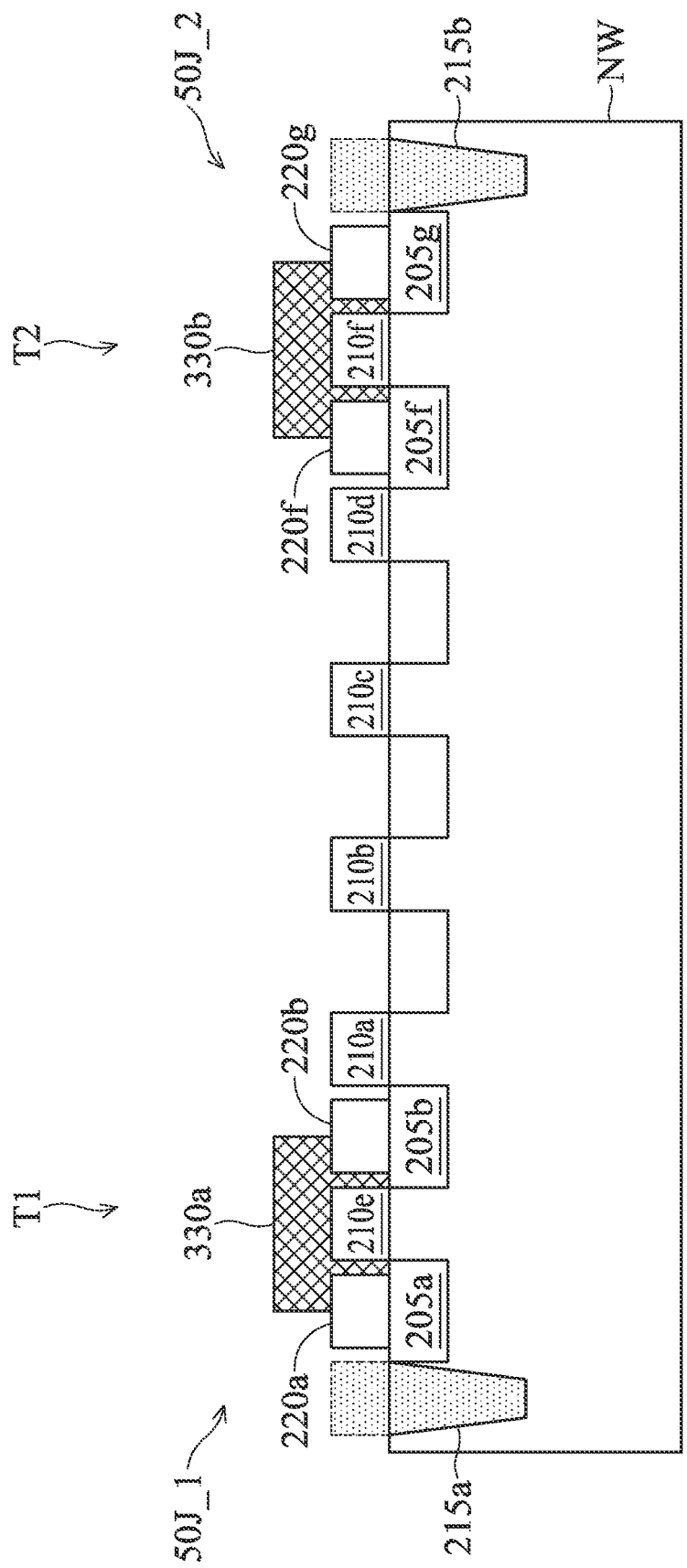
FIG. 13B shows a cross-sectional view of the semiconductor structure of the logic cell along line F-FF in FIG. 13A according to some embodiments of the invention.

FIG. 13B shows a cross-sectional view of the semiconductor structure of the logic cell 10J along line F-FF in FIG. 13A according to some embodiments of the invention. Referring to FIGS. 13A and 13B together, the source region 205a of the tie-gate transistor T1 is coupled to the connection feature 220a, and the drain region 205b of the tie-gate transistor T1 is coupled to the connection feature 220b. The gate structure 210e of the tie-gate transistor T1 is coupled to the connection features 220a and 220b through the connection feature 330a extending in the X-direction. Moreover, the source region 205g of the tie-gate transistor T2 is coupled to the connection feature 220g, and the drain region 205f of the tie-gate transistor T2 is coupled to the connection feature 220f. The gate structure 210f of the tie-gate transistor T2 is coupled to the connection features 220f and 220g through the connection feature 330b extending in the X-direction. In some embodiments, one or more process steps are used to form the connection feature 330a over the connection features 220a and 220b and the gate structure 210e and the connection feature 330b over the connection features 220f and 220g and the gate structure 210f. Furthermore, the connection feature 330a is in contact with the connection features 220a and 220b and the gate structure 210e, and the connection feature 330b is in contact with the connection features 220f and 220g and the gate structure 210f. Thus, the drain, gate and source regions of the tie-gate transistor T1 are coupled to the power line 20 through the fourth-type of interconnect structure 50J_1 formed by single connection feature 330a. The drain, gate and source regions of the tie-gate transistor T2 are coupled to the power line 20 through the fourth-type of interconnect structure 50J_2 formed by single connection feature 330b. In some embodiments, the fourth-type of interconnect structures 50J_1 and 50J_2 are mirrored in the Y-direction.

Figure 14:
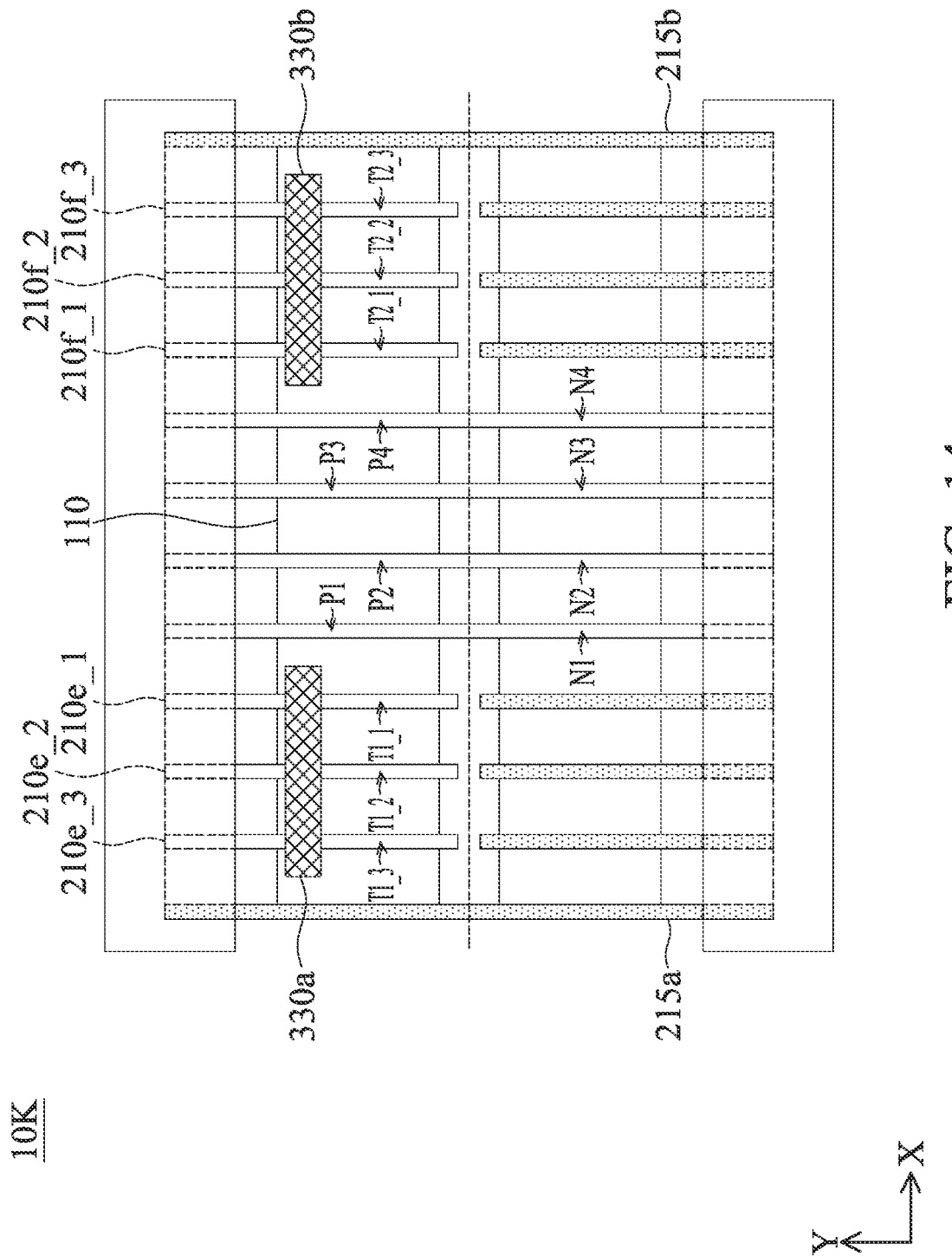
FIG. 14 shows a simplified diagram illustrating a logic cell according to some embodiments of the invention.

FIG. 14 shows a simplified diagram illustrating a logic cell 10K according to some embodiments of the invention. The outer boundary of the logic cell 10K is illustrated using dashed lines. The semiconductor structure of the logic cell 10K is similar to the semiconductor structure of the logic cell 10J of FIG. 13A, and the differences between FIG. 14 and FIG. 13A is that the logic cell 10K includes more tie-gate transistors T1_1 through T1_3 and more tie-gate transistors T2_1 through T2_3.

In FIG. 14, the extended connection feature 330a is coupled to the gate structures 210e_1 through 210e_3 and the corresponding source/drain regions of the tie-gate transistors T1_1 through T1_3. The extended metal line 330b is coupled to the gate structures 210f_1 through 210f_3 and the corresponding source/drain regions of the tie-gate transistors T2_1 through T2_3.

The logic cell 10K is capable of providing the specific logic function of the logic cell 10G with smaller cell delay since the distance between the P-type transistor P1 and the isolation structure 215a and the distance between the P-type transistor P4 and the isolation structure 215b are increased. Therefore, it is more avoided that the diffusion break stress at the left and right edges of the active region-110 will degrade the saturation drain current (Idsat) of the transistors in the logic cell 10K, especially the P-type transistors P1 and P4.

Figure 15:
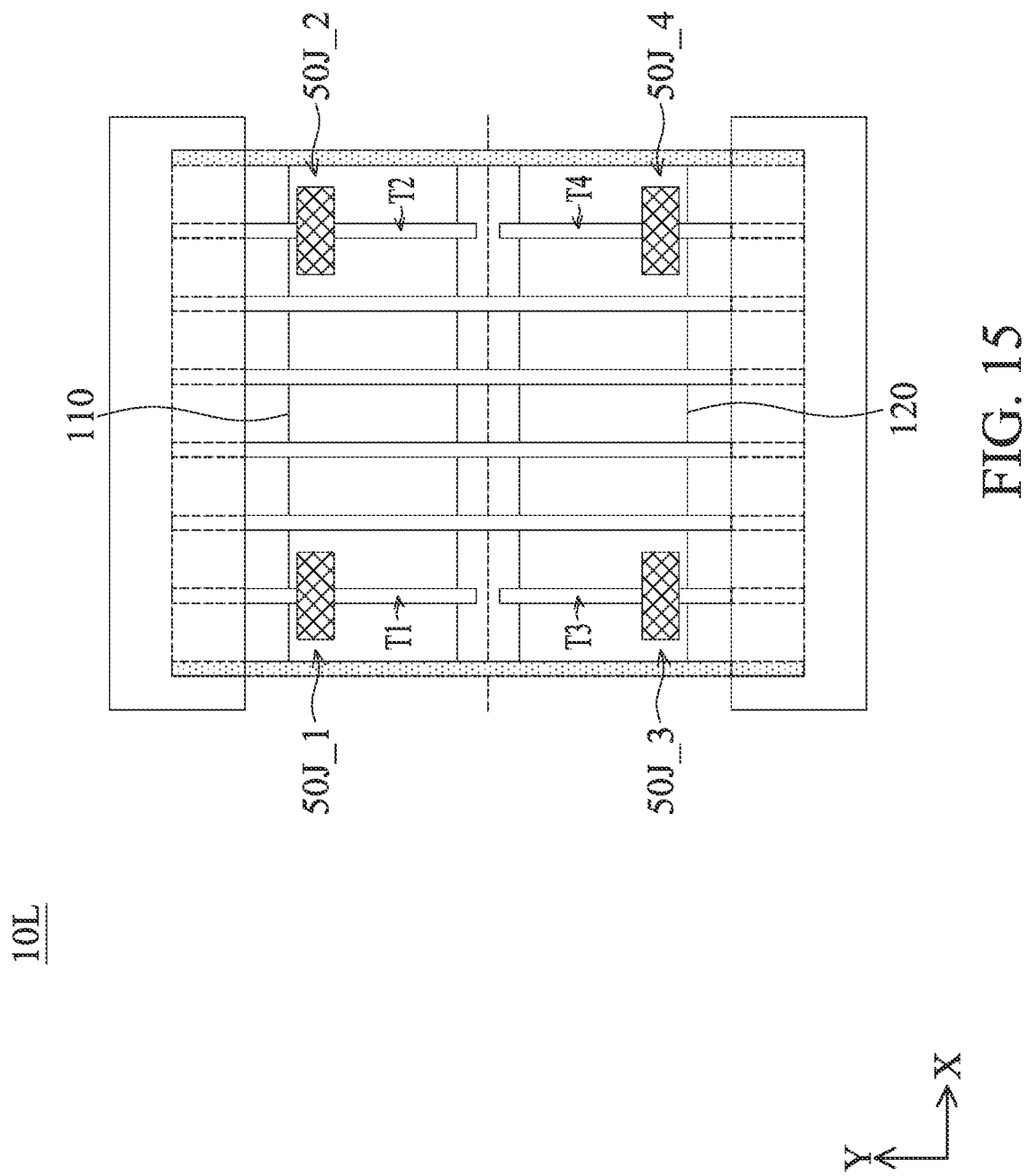
FIG. 15 shows a simplified diagram illustrating a logic cell according to some embodiments of the invention.

FIG. 15 shows a simplified diagram illustrating a logic cell 10L according to some embodiments of the invention. The outer boundary of the logic cell 10L is illustrated using dashed lines. The semiconductor structure of the logic cell 10L is similar to the semiconductor structure of the logic cell 10J of FIG. 13A, and the differences between FIG. 15 and FIG. 13A is that the logic cell 10L further includes the tie-gate transistors T3 and T4 over the active region 120.

In FIG. 15, the drain, gate and source regions of the tie-gate transistor T3 are coupled to the ground line 30 through the fourth-type of interconnect structure 50J_3. Moreover, the drain, gate and source regions of the tie-gate transistor T4 are coupled to the ground line 30 through the fourth-type of interconnect structure 50J_4. Thus, each of the tie-gate transistors T3 and T4 form a dummy N-type transistor that has the source region and drain region both coupled to its gate. In some embodiments, the fourth-type of interconnect structures 50J_1 and 50J_3 are mirrored in the X-direction, and the fourth-type of interconnect structures 50J_2 and 50G_4 are mirrored in the X-direction.

The logic cell 10L is capable of providing the specific logic function of the logic cell 10J with smaller cell delay since more tie-gate transistors (e.g., the transistors T3 and T4) are used. Therefore, it is more avoided that the diffusion break stress at the left and right edges of the active regions 110 and 120 will degrade the saturation drain current (Idsat) of the transistors in the logic cell 10L, especially the P-type transistors P1 and P4 and the N-type transistors N1 and N4.

Figure 16:
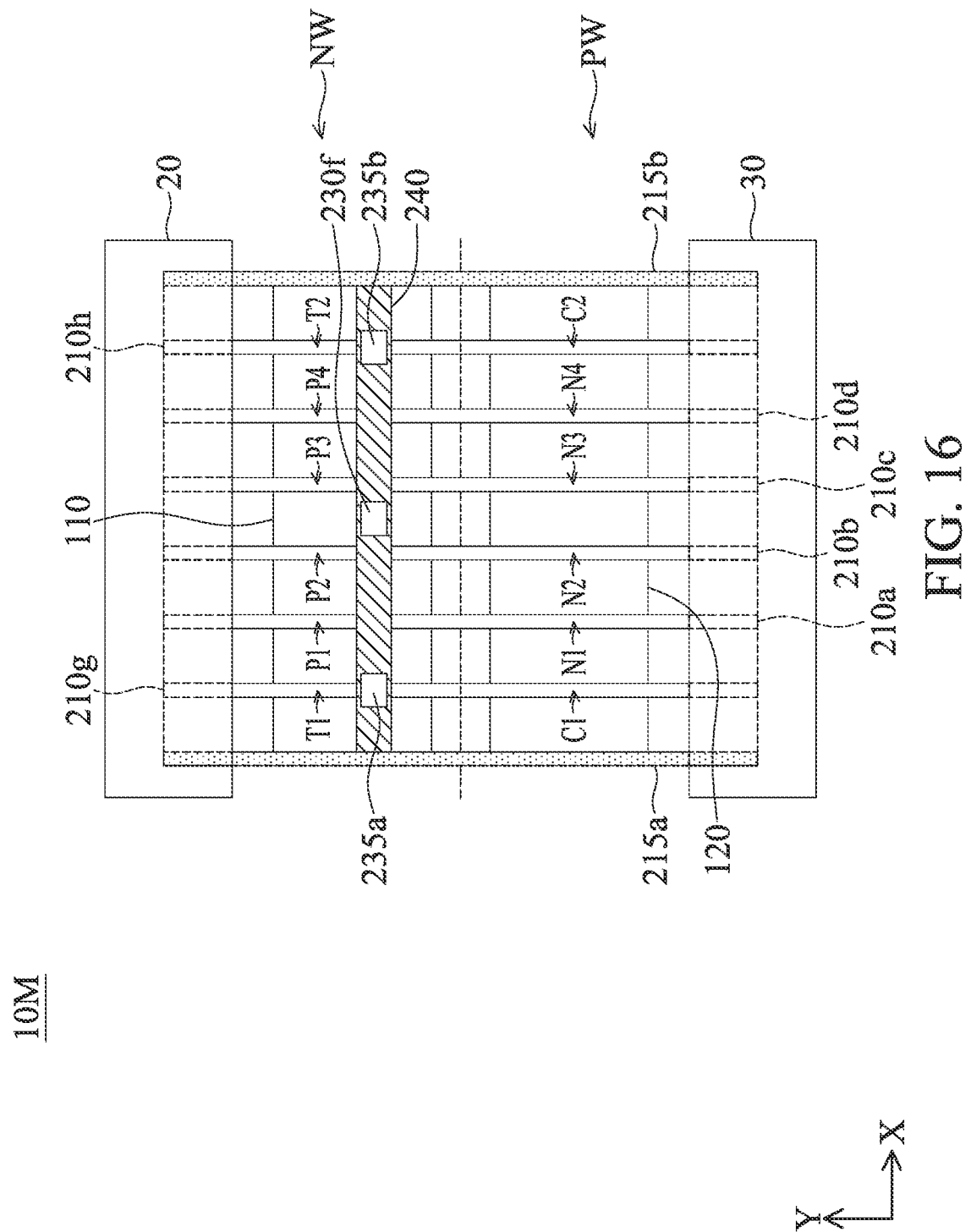
FIG. 16 shows a simplified diagram illustrating a logic cell according to some embodiments of the invention.

FIG. 16 shows a simplified diagram illustrating a logic cell 10M according to some embodiments of the invention. The outer boundary of the logic cell 10M is illustrated using dashed lines. The logic cell 10M is capable of providing a specific logic function similar to that of the logic cell 10A of FIG. 3A. The semiconductor structure of the logic cell 10M is similar to the semiconductor structure of the logic cell 10A of FIG. 3A, and the differences between FIG. 16 and FIG. 3A is that the gate structures 210e and 210f are replaced with the gate structures 210g and 210h, respectively.

The gate structures 210g and 210h extending in the Y-direction form the tie-gate transistors T1 and T2 in the active region 110 of the N-type well region NW. Moreover, the gate structures 210g and 210h extending in the Y-direction form the transistors C1 and C2 in the active region 120 of the P-type well region PW. It should be noted that the gate structures 210g and 210h and the gate structures 210a through 210d have the same length (e.g., equal to the cell height H1). In order to simplify the description, the connection features for connecting the source/drain regions of the transistors are omitted.

Compared with the gate structures 210e and 210f of the logic cell 10A of FIG. 3A, the gate structures 210g and 210h extend in the Y-direction and reach above the P-type well region PW. Thus, the logic cell 10M further includes the transistors C1 and C2. Each of the transistors C1 and C2 is a dummy N-type transistor that has the source region and drain region both coupled to the ground line 30. Furthermore, the gate structures 210g and 210h are coupled to the power line 20 through a first-type of interconnect structure formed by the metal line 240 and the corresponding connection features (e.g., 235a and 235b). Thus, each of the transistors C1 and C2 functions as a capacitor (e.g., a decoupling capacitor or a bypass capacitor) between the power line 20 and the ground line 30, thereby providing a more stable power supply and decreasing noise for the logic cell 10M.

Figure 17:
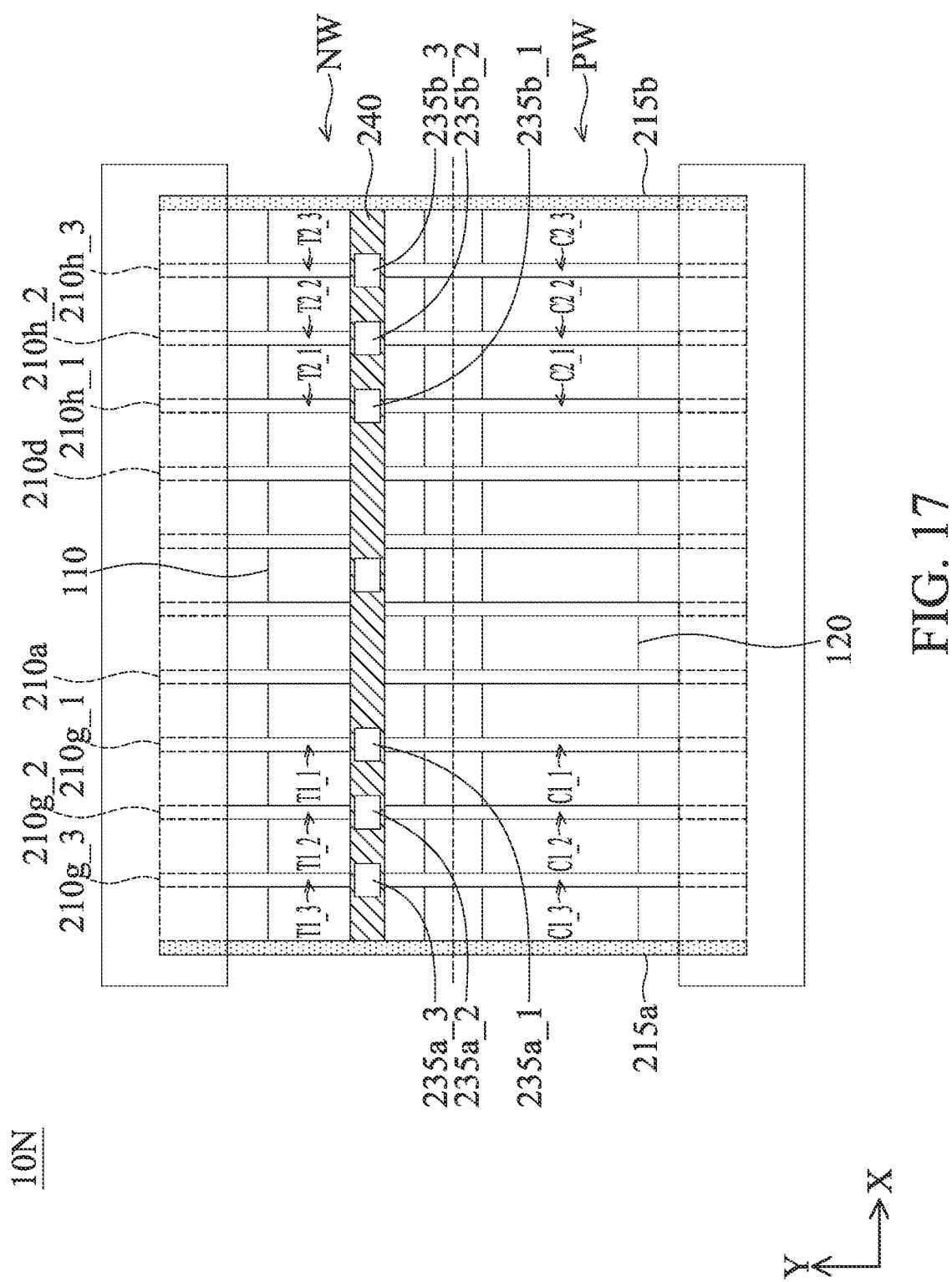
FIG. 17 shows a simplified diagram illustrating a logic cell according to some embodiments of the invention.

FIG. 17 shows a simplified diagram illustrating a logic cell 10N according to some embodiments of the invention. The outer boundary of the logic cell 10N is illustrated using dashed lines. The semiconductor structure of the logic cell 10N is similar to the semiconductor structure of the logic cell 10M of FIG. 16, and the differences between FIG. 17 and FIG. 16 is that the logic cell 10N includes more tie-gate transistors T1_1 through T1_3 and more tie-gate transistors T2_1 through T2_3 and more transistors C1_1 through C1_3 and more transistors C2_1 through C2_3.

In FIG. 17, the gate structures 210g_1 through 210g_3 are disposed between the gate structure 210a and the isolation structure 215a, and the gate structures 210h_1 through 210h_3 are disposed between the gate structure 210d and the isolation structure 215b. Moreover, the extended connection feature 240 is coupled to the gate structures 210g_1 through 210g_3 and 210h_1 through 210h_3 via the corresponding connection feature 235a_1 through 235a_3 and 235b_1 through 235b_3, respectively. It should be noted that the number of gate structures 210g_1 through 210g_3 and 210h_1 through 210h_3 are used as an example, and not to limit the disclosure.

The logic cell 10N is capable of providing the specific logic function of the logic cell 10M with smaller cell delay since the distance between the P-type transistor P1 and the isolation structure 215a and the distance between the P-type transistor P4 and the isolation structure 215b are increased. Therefore, it is more avoided that the diffusion break stress at the left and right edges of the active regions 110 and 120 will degrade the saturation drain current (Idsat) of the transistors in the logic cell 10N, especially the P-type transistors P1 and P4 and the N-type transistors N1 and N4.

Figure 18:
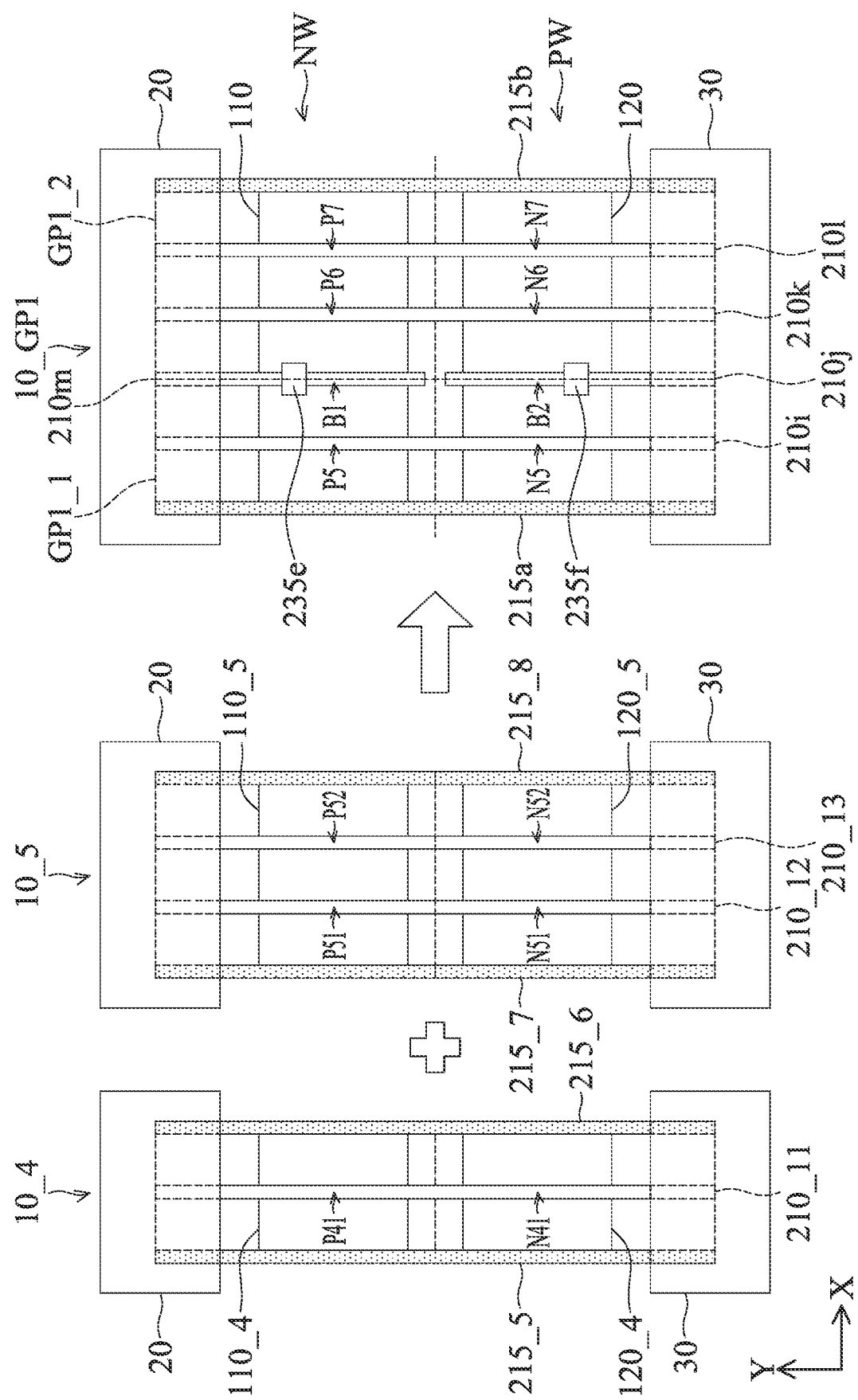
FIG. 18 shows a simplified diagram illustrating a grouping logic cell according to some embodiments of the invention.

FIG. 18 shows a simplified diagram illustrating a grouping logic cell 10_GP1 according to some embodiments of the invention. In FIG. 18, the logic cell 10_4 includes the P-type transistor P41 and the N-type transistor N41 configured to perform a fourth logic function. The gate structure 210_11 extending in the Y-direction forms the P-type transistor P41 in the active region 110_4 of the N-type well region NW and N-type transistor N41 in the active region 120_4 of the P-type well region PW. The logic cell 10_5 includes the P-type transistors P51 and P52 and the N-type transistors N51 and N52 configured to perform a fifth logic function. The gate structures 210_12 and 210_13 extending in the Y-direction forms the P-type transistors P51 and P52 in the active region 110_5 of the N-type well region NW and N-type transistors N51 and N52 in the active region 120_5 of the P-type well region PW. In some embodiments, the fourth logic function is the same as the fifth logic function. In some embodiments, the fourth logic function is different from the fifth logic function.

In the logic cell 10_4, the isolation structures 215_5 and 215_6 are formed in the boundary of the logic cell 10_4 to define the active regions 110_4 and 120_4. In the logic cell 10_5, the isolation structures 215_7 and 215_8 are formed in the boundary of the logic cell 10_5 to define the active regions 110_5 and 120_5. The active regions 110_4 and 120_4 are separated from the active regions 110_5 and 120_5.

In FIG. 18, the logic cell 10_4 and the logic cell 10_5 are merged into the grouping logic cell 10_GP1. The grouping logic cell 10_GP1 is capable of providing the fourth and fifth logic function with smaller cell delay. The grouping logic cell 10_GP1 is arranged between the power line 20 and the ground line 30, and has a cell height H1. Furthermore, the outer boundary of the grouping logic cell 10_GP1 is illustrated using dashed lines.

The grouping logic cell 10_GP1 is divided into a first sub-cell GP1_1 and a second sub-cell GP1_2. In the first sub-cell GP1_1, the gate structure 210i extending in the Y-direction forms the P-type transistor P5 in the active region 110 and the N-type transistor N5 in the active region 120. The P-type transistor P5 and the N-type transistor N5 are configured to perform the fourth function. In other words, the first sub-cell GP1_1 functions as the logic cell 10_4. In the second sub-cell GP1_2, the gate structures 210k and 210l extending in the Y-direction forms the P-type transistors P6 and P7 in the active region 110 and the N-type transistors N6 and N7 in the active region 120. The P-type transistors P6 and P7 and the N-type transistors N6 and N7 are configured to perform the fifth logic function. In other words, the second sub-cell GP1_2 functions as the logic cell 10_5.

In the grouping logic cell 10_GP1, the gate structures 210j and 210m extending in the Y-direction are arranged between the gate structures 210i and 210k. Furthermore, the gate structures 210j and 210m are disposed at the interface between the first sub-cell GP1_1 and the second sub-cell GP1_2. The gate structures 210j and 210m are shorter than the gate structures 210i, 210k and 210l.

The gate structure 210m forms the P-type transistor B1 in the active region 110, and the gate structure 210j forms the N-type transistor B2 in the active region 120. In the grouping logic cell 10_GP1, the drain region of the P-type transistor B1 and the source region of the P-type transistor P6 share the same common source/drain region, and the source region of the P-type transistor B1 and the source region of the P-type transistor P5 share the same common source/drain region. Furthermore, the drain region of the N-type transistor B2 and the source region of the N-type transistor N6 share the same common source/drain region, and the source region of the N-type transistor B2 and the source region of the N-type transistor N5 share the same common source/drain region. In some embodiments, the source and drain regions of the P-type transistor B1 are coupled to the power line 20. In some embodiments, the source and drain regions of the N-type transistor B2 are coupled to the ground line 30. As described above, the gate structures 210i through 210l are arranged between the isolation structures 215a and 215b with a fixed pitch PH.

In some embodiments, the gate structure 210m is coupled to the power line 20 through the connection feature 235e. Thus, the P-type transistor B1 is a dummy transistor that has the source region and drain region both coupled to its gate, i.e., the P-type transistor B1 is independent of the fourth and fifth logic function.

In some embodiments, the gate structure 210j is coupled to the ground line 30 through the connection feature 235f. Thus, the N-type transistor B2 is a dummy transistor that has the source region and drain region both coupled to its gate, i.e., the N-type transistor B2 is independent of the fourth and fifth logic function.

The first sub-cell GP1_1 in the grouping logic cell 10_GP1 is capable of providing the fourth logic function of the logic cell 10_4 with smaller cell delay since the distance between the P-type transistor P5 and the isolation structure 215b is increased (compared to the distance between the P-type transistor P41 and the isolation structure 215_6). Similarly, the second sub-cell GP1_2 in the grouping logic cell 10_GP1 is capable of providing the fifth logic function of the logic cell 10_5 with smaller cell delay since the distance between the P-type transistor P6 and the isolation structure 215a is increased (compared to the distance between the P-type transistor P51 and the isolation structure 215_7). It should be noted that the number of sub cells of the grouping logic cell 10_GP1 is used as an example, and not to limit the disclosure.

Figure 19:
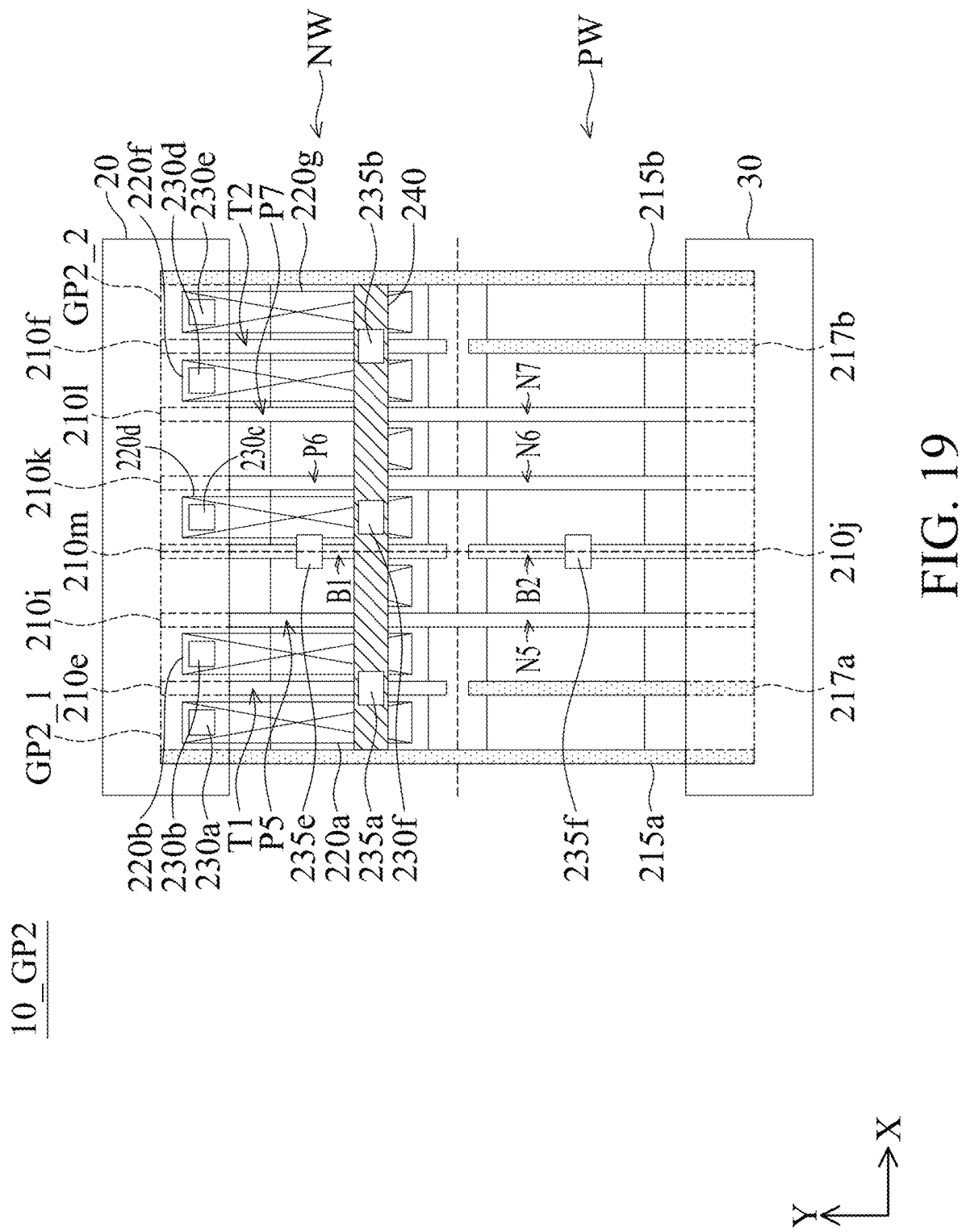
FIG. 19 shows a simplified diagram illustrating a grouping logic cell according to some embodiments of the invention.

FIG. 19 shows a simplified diagram illustrating a grouping logic cell 10_GP2 according to some embodiments of the invention. The outer boundary of the grouping logic cell 10_GP2 is illustrated using dashed lines. The semiconductor structure of the grouping logic cell 10_GP2 is similar to the semiconductor structure of the grouping logic cell 10_GP1 of FIG. 18, and the differences between FIG. 19 and FIG. 18 is that the grouping logic cell 10_GP2 further includes the tie-gate transistor T1 in the first sub-cell GP2_1 and the tie-gate transistor T2 in the second sub-cell GP2_2.

In FIG. 19, the gate structure 210e extending in the Y-direction form the tie-gate transistor T1 in the active region 110, and the gate structure 210f extending in the Y-direction form the tie-gate transistor T2 in the active region 110. It should be noted that the gate structures 210e and 210f only extends above the N-type well region NW, and does not extend above the P-type well region PW. Therefore, the gate structures 210e and 210f are shorter than the gate structures 210i, 210k and 210l.

Moreover, the dielectric-base gate structure 217a extending in the Y-direction is disposed between the gate structure 210i and the isolation structure 215a and over the active region 120. Moreover, the dielectric-base gate structure 217b extending in the Y-direction is disposed between the gate structure 210i and the isolation structure 215b and over the active region 120. It should be noted that the dielectric-base gate structures 217a and 217b only extends above the P-type well region PW, and does not extend above the N-type well region NW. Therefore, the dielectric-base gate structures 217a and 217b are shorter than the gate structures 210i, 210k and 210l.

In FIG. 19, the drain, gate and source regions of the tie-gate transistors T1 and T2 are coupled to the power line 20 through a first-type of interconnect structure formed by the metal line 240 and the corresponding connection features (e.g., the connection features 235a, 235b and 230f), as shown in FIGS. 3A, and 3B. For example, the drain, gate and source regions of the tie-gate transistor T1 are coupled to the power line 20 through the first-type of interconnect structure including the connection features 220a, 220b, 220d, 230a, 230b, 230c, 230f, 235a and the power line 20. For example, the drain, gate and source regions of the tie-gate transistor T2 are coupled to the power line 20 through the first-type of interconnect structure including the connection features 220d, 220f, 220g, 230c, 230d, 230e, 230f, 235b and the power line 20. In some embodiments, the N-type tie-gate transistors (e.g., the tie-gate transistors T3 and T4 of FIG. 6) may be used in the grouping logic cell 10_GP2. In some embodiments, the grouping logic cell 102 further includes the transistors C1 and C2 in the active region 120, as shown in FIG. 16. In some embodiments, by inserting more tie-gate transistors (e.g., the tie-gate transistors T1_1 through T1_3 and the tie-gate transistors T2_1 through T2_3 of FIG. 4) between the gate structure 210e and the isolation structure 215a and between the gate structure 210f and the isolation structure 215b, the grouping logic cell 10_GP2 is capable of providing the fourth and fifth logic function with smaller cell delay.

In some embodiments, the drain, gate and source regions of the tie-gate transistors T1 and T2 are coupled to the power line 20 through the second-type of interconnect structure, as shown in FIGS. 7A, 7B, 8 and 9.

In some embodiments, the drain, gate and source regions of the tie-gate transistors T1 and T2 are coupled to the power line 20 through the third-type of interconnect structure, as shown in FIGS. 10A, 10B, 11 and 12.

In some embodiments, the drain, gate and source regions of the tie-gate transistors T1 and T2 are coupled to the power line 20 through the fourth-type of interconnect structure, as shown in FIGS. 13A, 13B, 14 and 15.

Figure 20:
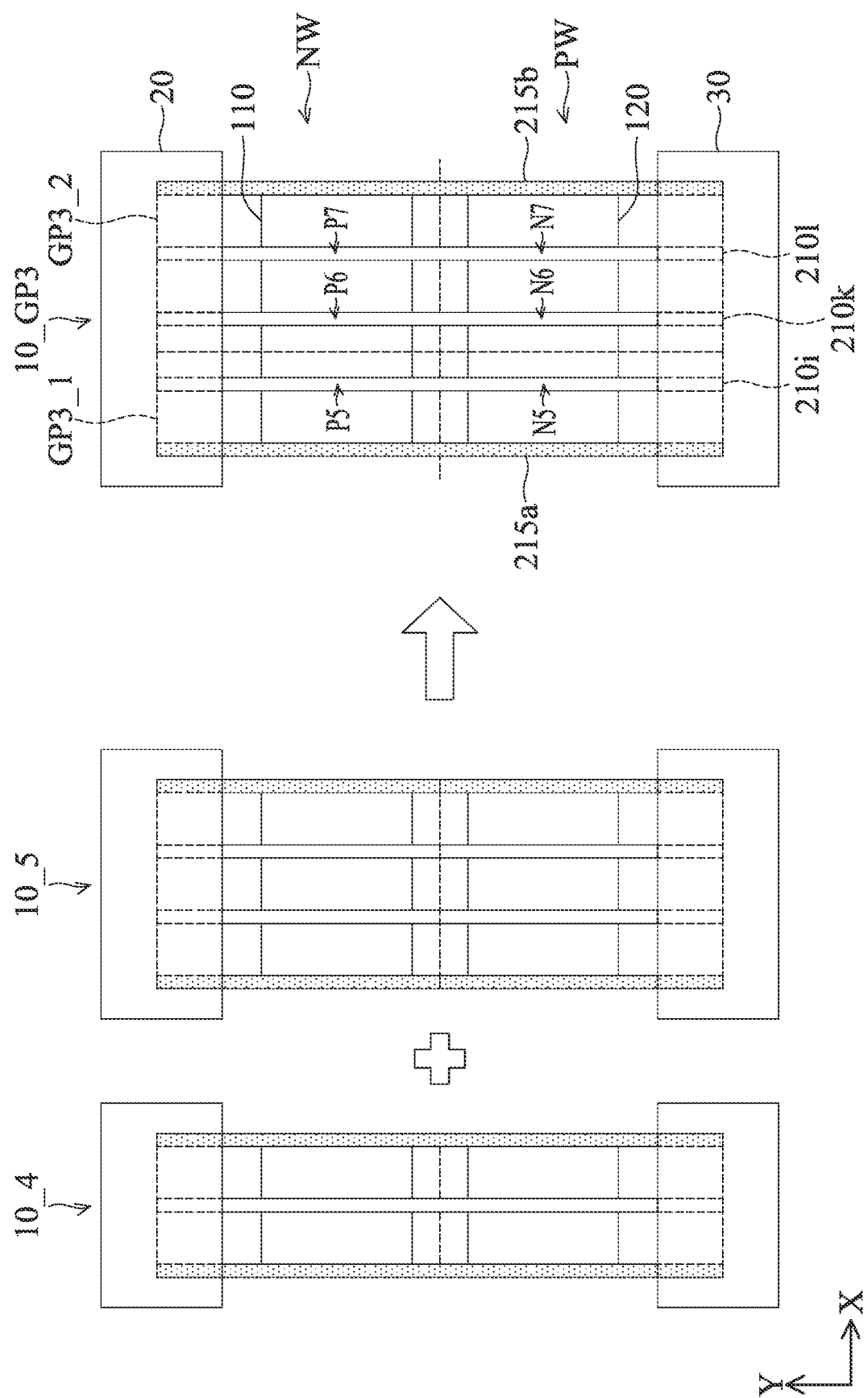
FIG. 20 shows a simplified diagram illustrating a grouping logic cell according to some embodiments of the invention.

FIG. 20 shows a simplified diagram illustrating a grouping logic cell 10_GP3 according to some embodiments of the invention. In FIG. 20, the logic cell 10_4 and the logic cell 10_5 are merged into the grouping logic cell 10_GP3. The grouping logic cell 10_GP3 is capable of providing the fourth and fifth logic function with small cell delay. Furthermore, the outer boundary of the grouping logic cell 10_GP3 is illustrated using dashed lines.

The grouping logic cell 10_GP3 is divided into a first sub-cell GP3_1 and a second sub-cell GP3_2. The first sub-cell GP3_1 includes the P-type transistor P5 and the N-type transistor N5, and the first sub-cell GP3_1 functions as the logic cell 10_4. The second sub-cell GP3_2 includes the P-type transistors P6 and P7 and the N-type transistors N6 and N7, and the second sub-cell GP3_2 functions as the logic cell 10_5.

The semiconductor structure of the grouping logic cell 10_GP3 is similar to the semiconductor structure of the grouping logic cell 10_GP1 of FIG. 18, and the differences between FIG. 20 and FIG. 18 is that the grouping logic cell 10_GP3 does not include the gate structure 210j. The source regions of the P-type transistors P5 and P6 share the common source/drain region, and the source regions of the N-type transistors N5 and N6 share the common source/drain region. Thus, compared with the grouping logic cell 10_GP1 of FIG. 18, the grouping logic cell 10_GP3 has smaller area. It should be noted that the number of sub cells of the grouping logic cell 10_GP3 is used as an example, and not to limit the disclosure.

Figure 21:
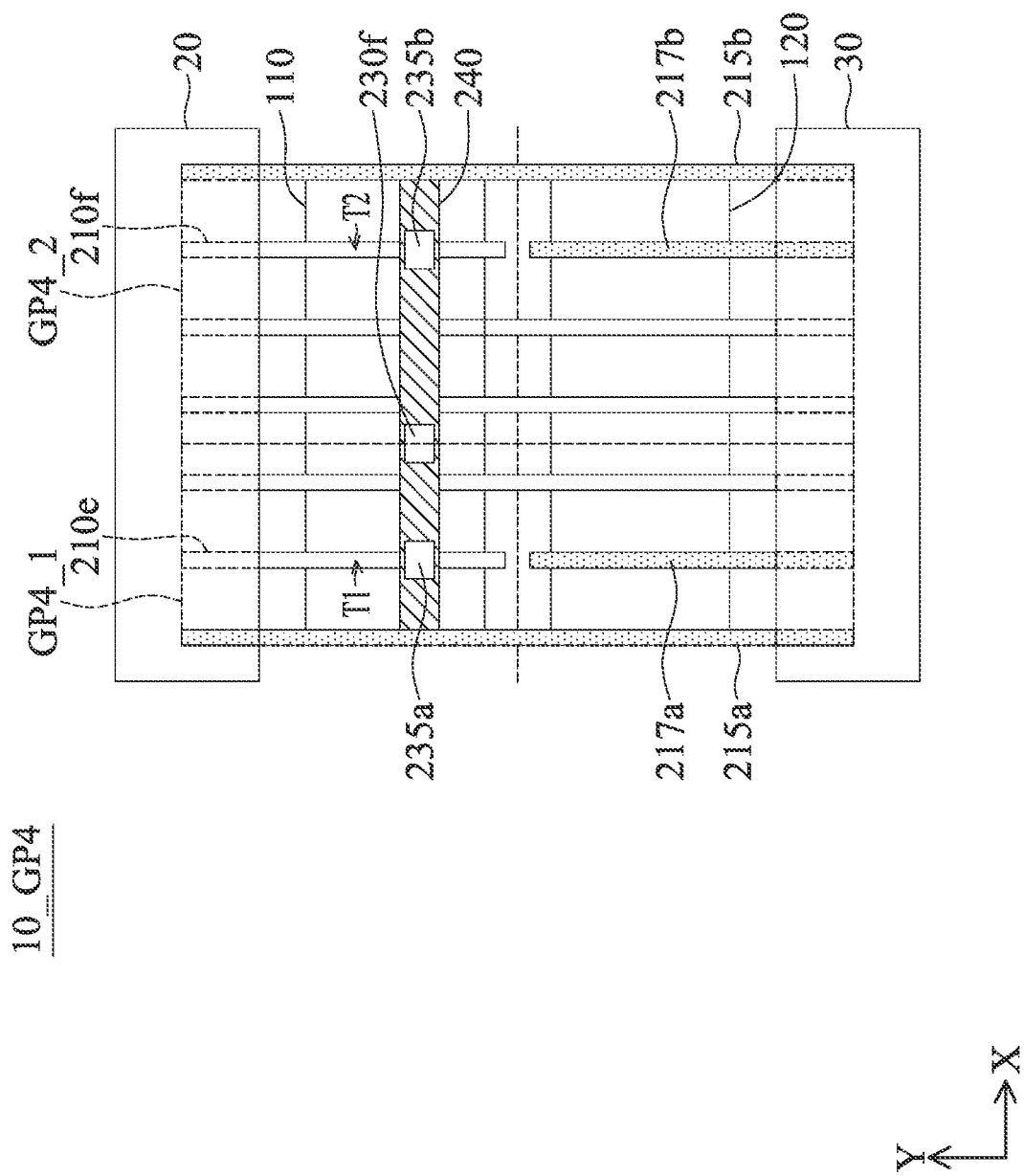
FIG. 21 shows a simplified diagram illustrating a grouping logic cell according to some embodiments of the invention.

FIG. 21 shows a simplified diagram illustrating a grouping logic cell 10_GP4 according to some embodiments of the invention. The outer boundary of the grouping logic cell 10_GP4 is illustrated using dashed lines. The semiconductor structure of the grouping logic cell 10_GP4 is similar to the semiconductor structure of the grouping logic cell 10_GP3 of FIG. 20, and the differences between FIG. 21 and FIG. 20 is that the grouping logic cell 10_GP4 further includes the tie-gate transistor T1 in the first sub-cell GP4_1 and the tie-gate transistor T2 in the second sub-cell GP4_2.

In FIG. 21, the drain, gate and source regions of the tie-gate transistors T1 and T2 are coupled to the power line 20 through a first-type of interconnect structure formed by the metal line 240 and the corresponding connection features (e.g., the connection features 235a, 235b and 230f). In some embodiments, the N-type tie-gate transistors (e.g., the tie-gate transistors T3 and T4 of FIG. 6) may be used in the grouping logic cell 10_GP4. In some embodiments, the grouping logic cell 10_GP4 further includes the transistors C1 and C2 in the active region 120, as shown in FIG. 16. In some embodiments, by inserting more tie-gate transistors (e.g., the tie-gate transistors T1_1 through T1_3 and the tie-gate transistors T2_1 through T2_3 of FIG. 4) between the gate structure 210e and the isolation structure 215a and between the gate structure 210f and the isolation structure 215b, the grouping logic cell 10_GP4 is capable of providing the fourth and fifth logic function with smaller cell delay.

In some embodiments, the drain, gate and source regions of the tie-gate transistors T1 and T2 are coupled to the power line 20 through the second-type of interconnect structure, as shown in FIGS. 7A, 7B, 8 and 9.

In some embodiments, the drain, gate and source regions of the tie-gate transistors T1 and T2 are coupled to the power line 20 through the third-type of interconnect structure, as shown in FIGS. 10A, 10B, 11 and 12.

In some embodiments, the drain, gate and source regions of the tie-gate transistors T1 and T2 are coupled to the power line 20 through the fourth-type of interconnect structure, as shown in FIGS. 13A, 13B, 14 and 15.

In the embodiments, the semiconductor structures of logic cells capable of reducing delay time are provided. By inserting the tie-gate transistors at the boundary of the logic cell that require high-speed operation, the diffusion edge is extended for diffusion break stress mitigation. Thus, the saturation drain current (Idsat) of the transistors in the logic cell will not be degraded, and then operation speed of the logic cell is increased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a semiconductor substrate; and
a logic cell with a logic function, and comprising:
a plurality of first transistors in an active region over the semiconductor substrate, comprising first gate electrodes extending along a first direction;
a second transistor in the active region, comprising a second gate electrode extending along the first direction;
a third transistor in the active region, comprising a third gate electrode extending along the first direction; and
a first isolation structure and a second isolation structure on opposite edges of the active region and extending along the first direction,
wherein the first gate electrodes are disposed between the first and second isolation structures, the second gate electrode is disposed between the first gate electrodes and the first isolation structure, and the third gate electrode is disposed between the first gate electrodes and the second isolation structure,
wherein the first and second isolation structures and the first gate electrode have a first length in the first direction, and the second and third gate electrodes have a second length in the first direction, and the second length is shorter than the first length, wherein the first transistors are configured to perform the logic function, and the second and third transistors are dummy transistors.

2. The semiconductor structure as claimed in claim 1, wherein drain, source and gate of the second and third transistors are coupled to a power line extending in a second direction, and the second direction is perpendicular to the first direction.

3. The semiconductor structure as claimed in claim 1, wherein the second and third gate electrodes are coupled to a source region of one of the plurality of first transistor through a single metal line extending in a second direction, and the second direction is perpendicular to the first direction.

4. The semiconductor structure as claimed in claim 1, wherein source region and drain region of the second transistor are coupled to a first metal line extending in a second direction, and the first metal line is coupled to the second gate electrode through a second metal line extending in the first direction and a third metal line extending in the second direction, wherein the second direction is perpendicular to the first direction, and the first and third metal lines are formed in the same metal layer under the second metal line.

5. The semiconductor structure as claimed in claim 1, wherein the second gate electrode is coupled to drain region and source region of the second transistor through a first metal line extending in a second direction between the first isolation structure and the first gate electrodes, and the third gate electrode is coupled to drain region and source region of the third transistor through a second metal line extending in the second direction between the second isolation structure and the first gate electrodes, wherein the second direction is perpendicular to the first direction.

6. The semiconductor structure as claimed in claim 1, wherein the second gate electrode is coupled to drain region and source region of the second transistor through a first single connection structure extending in a second direction, and the third gate electrode is coupled to drain region and source region of the third transistor through a second single connection structure extending in the second direction, wherein the second direction is perpendicular to the first direction.

7. The semiconductor structure as claimed in claim 1, wherein the first isolation structure, the second gate electrode, the first gate electrodes, the third gate electrode, and the second isolation structure are sequentially arranged with a fixed pitch.

* * * * *